(12) United States Patent
Yang et al.

(10) Patent No.: US 10,567,118 B2
(45) Date of Patent: Feb. 18, 2020

(54) CODING TO IMPROVE TRANSMISSION AND RECEPTION PROCESSING TIME

(71) Applicant: QUALCOMM Incorporated, San Diego, CA (US)

(72) Inventors: Yang Yang, San Diego, CA (US); Jing Jiang, San Diego, CA (US); Jamie Menjay Lin, San Diego, CA (US); Peter Pui Lok Ang, San Diego, CA (US); Gabi Sarkis, San Diego, CA (US); John Edward Smee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 286 days.

(21) Appl. No.: 15/650,603

(22) Filed: Jul. 14, 2017

(65) Prior Publication Data

US 2018/0048426 A1 Feb. 15, 2018

Related U.S. Application Data

(60) Provisional application No. 62/375,326, filed on Aug. 15, 2016.

(51) Int. Cl.
*H04L 1/00* (2006.01)
*H03M 13/29* (2006.01)
(Continued)

(52) U.S. Cl.
CPC .......... *H04L 1/0071* (2013.01); *H03M 13/29* (2013.01); *H04J 13/0003* (2013.01);
(Continued)

(58) Field of Classification Search
CPC .... H04L 1/0041; H04L 1/0059; H04L 1/0067
See application file for complete search history.

(56) References Cited

U.S. PATENT DOCUMENTS

| 4,823,201 A * | 4/1989 | Simon ................. H04N 19/50 |
|---|---|---|
| | | 375/240.08 |
| 2010/0153826 A1 | 6/2010 | Cho et al. |

OTHER PUBLICATIONS

Hagenauer et al., "The Performance of Rate-Compatible Punctured Convolutional Codes for Digital Mobile Radio," IEEE Transactions on Communications, Jul. 1990, pp. 966-980, vol. 38, No. 7, XP000159539, institute of Electricai and Electronics Engineers. (Year: 1990).*

(Continued)

*Primary Examiner* — Siming Liu
(74) *Attorney, Agent, or Firm* — Holland & Hart LLP/Qualcomm

(57) ABSTRACT

Methods, systems, and devices for wireless communication are described. The method, systems, and devices may include receiving a plurality of sets of input bits associated with respective transmission symbol periods at an encoder of a transmitting device, the plurality of sets of input bits associated with a single input vector to be encoded into a single codeword. The encoder may process the plurality of sets of input bits to generate a plurality of sets of output bits associated with respective transmission symbol periods, and output a first of the plurality of sets of output bits associated with a first of the plurality of sets of input bits prior receiving a second of the plurality of sets of input bits, the second of the plurality of sets of input bits being received at the encoder subsequent to the first of the plurality of sets of input bits.

30 Claims, 16 Drawing Sheets

(51) Int. Cl.
  *H04J 13/00* (2011.01)
  *H03M 13/11* (2006.01)
(52) U.S. Cl.
  CPC .......... *H04L 1/0009* (2013.01); *H04L 1/0056* (2013.01); *H03M 13/1102* (2013.01)

(56) References Cited

OTHER PUBLICATIONS

Hagenauer, "Rate-Compatible Punctured Convolutional Codes (RCPC Codes) and Their Applications," IEEE Transactions on Communications, Apr. 1988, pp. 389-400, vol. 36, No. 4, XPQQ0670428, institute of Electrical and Electronics Engineers. (Year: 1988).*

Hehn et al, "LDPC Codes and Constitutional Codes with Equal Structural Delay: A Comparison," IEEE Transactions on Communications, Jun. 2009, vol. 57, No. 6, IEEE (Year: 2009).*

Hagenauer et al., "The Performance of Rate-Compatible Punctured Convolutional Codes for Digital Mobile Radio," IEEE Transactions on Communications, Jul. 1990, pp. 966-980, vol. 38, No. 7, XP000159539, Institute of Electrical and Electronics Engineers.

Hagenauer, "Rate-Compatible Punctured Convolutional Codes (RCPC Codes) and Their Applications," IEEE Transactions on Communications, Apr. 1988, pp. 389-400, vol. 36, No. 4, XP000670428, Institute of Electrical and Electronics Engineers.

Hehn et al., "LDPC Codes and Convolutional Codes with Equal Structural Delay: A Comparison," IEEE Transactions on Communications, Jun. 2009, vol. 57, No. 6, XP011262822, pp. 1683-1692, Institute of Electrical and Electronics Engineers.

ISA/EP, International Search Report and Written Opinion of the International Searching Authority, Int'l Application No. PCT/US2017/042419, dated Oct. 19, 2017, European Patent Office, Rijswijk, NL, 18 pgs.

Dossel L., et al., "Anytime Reliability of Systematic LDPC Convolutional Codes", Communications (ICC), 2012 IEEE International Conference on, IEEE, Jun. 10, 2012, XP032274412, DOI:10.1109/ICC.2012.6364586, ISBN: 978-1-4577-2052-9, pp. 2171-2175.

Zhang N., et al., "Anytime Properties of Protograph-based Repeat Accumulate Codes", 2015 IEEE Information Theory Workshop—Fall (ITW), IEEE, Oct. 11, 2015, XP032835207, pp. 177-181, DOI: 1 0.1109/ITWF.2015.7360758 [retrieved on Dec. 17, 2015].

* cited by examiner

CODING TO IMPROVE TRANSMISSION AND RECEPTION PROCESSING TIME

CROSS REFERENCES

The present Application for Patent claims priority to U.S. Provisional Patent Application No. 62/375,326 by Yang, et al., entitled "Coding To Improve Transmission and Reception Processing Time," filed Aug. 15, 2016, assigned to the assignee hereof.

INTRODUCTION

The following relates generally to wireless communication, and more specifically to coding to improve transmission and reception processing time.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may be otherwise known as user equipment (UE).

An error correcting code (ECC) may be used for improving throughput and reliability in channels with varying signal-to-noise ratio (SNR). Generally, an ECC adds redundancy information that allows a receiver to correctly reconstruct a transmitted signal in the presence of noise that may corrupt portions of the transmission. Types of ECCs include convolutional codes (CCs), turbo codes, low-density parity check (LDPC) codes, and the like. CCs are a family of codes that can be applied to a bit or symbol stream of arbitrary length. A terminated CC starts and ends at a known state. While terminated CCs have the benefit of starting and ending at the same known state (e.g., state 0), they also require extra bits to be added, thereby reducing the effective data rate. Tail biting CCs (TBCCs) are a type of CC created by cyclic shifting the last few information bits (tail bits) in a CC to the beginning. Accordingly, the TBCC starts and ends at the same state (determined by these tail bits) without the impact to data rates of terminated CCs. A decoder employs a decoding technique that attempts to select a codeword (which may be, for example, encoded bits associated with a single same physical channel message) with a maximum likelihood of being the codeword that was sent, based at least in part on the received symbol information and properties of codewords inherent to the encoding scheme. The Viterbi algorithm (VA), which finds the most likely codeword (path), may be used for decoding codewords encoded with a terminated CC or TBCC. The list Viterbi algorithm (LVA) further reduces the codeword error rate by generating a list of the most likely paths, which are then tested in sequence against an error checking function to select the most likely candidate satisfying the error checking function.

An ECC may be employed to encode an input vector of known length to generate an encoded codeword. For example, an ECC may be used in combination with a checking function that takes a set of information bits of known length and adds a check code, which may be transmitted along with the information bits. A receiving device may detect errors in the received data based on checking the received information bits against the received check code. One commonly employed checking function is a cyclic redundancy check (CRC). In some cases, additional processing may be performed on an encoded codeword such as interleaving, rate matching, and symbol mapping prior to transmission. Use of larger encoded codewords reduces overhead and provides higher coding gain. However, larger encoded codewords result in a larger decoding delay and overall system latency. In contrast, smaller encoded codewords reduce latency or decoding delay but results in an increase in overhead and lower coding gain.

SUMMARY

A method of wireless communication is described. The method may include receiving, at an encoder of a transmitting device, a plurality of sets of input bits associated with a single input vector to be encoded into a single codeword, processing, by the encoder, the plurality of sets of input bits, including a first set of input bits and a second set of input bits, to generate a plurality of sets of output bits, each set of output bits associated with one of a plurality of transmission symbol periods, and outputting, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits.

An apparatus for wireless communication is described. The apparatus may include means for receiving, at an encoder of the transmitting device, a plurality of sets of input bits associated with a single input vector to be encoded into a single codeword, means for processing, by the encoder, the plurality of sets of input bits, including a first set of input bits and a second set of input bits, to generate a plurality of sets of output bits, each set of output bits associated with one of a plurality of transmission symbol periods, and means for outputting, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits.

Another apparatus for wireless communication is described. The apparatus may include a processor, memory in electronic communication with the processor, and instructions stored in the memory. The processor and memory may be configured to receive, at an encoder of the transmitting device, a plurality of sets of input bits associated with a single input vector to be encoded into a single codeword, process, by the encoder, the plurality of sets of input bits, including a first set of input bits and a second set of input bits, to generate a plurality of sets of output bits, each set of output bits associated with one of a plurality of transmission symbol periods, and output, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits.

A non-transitory computer readable medium for wireless communication is described. The non-transitory computer-readable medium may include instructions operable to cause a processor to receive, at an encoder of the transmitting device, a plurality of sets of input bits associated with a single input vector to be encoded into a single codeword, process, by the encoder, the plurality of sets of input bits, including a first set of input bits and a second set of input bits, to generate a plurality of sets of output bits, each set of output bits associated with one of a plurality of transmission symbol periods, and output, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits.

Some examples of the method, apparatus, and non-transitory computer-readable medium described above may further include processes, features, means, or instructions for performing interleaving of each of the plurality of sets of output bits independently of each other of the plurality of sets of output bits.

Some examples of the method, apparatus, and non-transitory computer-readable medium described above may further include processes, features, means, or instructions for performing interleaving of a first of the plurality of sets of output bits independently of each other of the plurality of sets of output bits before receiving all the input bits associated with the single input vector at the encoder.

Some examples of the method, apparatus, and non-transitory computer-readable medium described above may further include processes, features, means, or instructions for performing rate matching on the first set of output bits to match a number of bits of the first set of output bits to a set of resources in the first transmission symbol period.

Some examples of the method, apparatus, and non-transitory computer-readable medium described above may further include processes, features, means, or instructions for performing rate matching on the first set of output bits to match the number of bits of the first set of output bits to the set of resources in the first transmission symbol period before receiving all the input bits associated with the single input vector at the encoder.

Some examples of the method, apparatus, and non-transitory computer-readable medium described above may further include processes, features, means, or instructions for transmitting, from the transmitting device, the first set of output bits in the first transmission symbol period before a last input bit of the plurality of sets of input bits may be received at the encoder of the transmitting device.

In some examples of the method, apparatus, and non-transitory computer-readable medium described above, the first set of output bits may be transmitted in the first transmission symbol period before a last input bit of the second set of input bits may be received at the encoder of the transmitting device.

In some examples of the method, apparatus, and non-transitory computer-readable medium described above, the first set of output bits may be transmitted in the first transmission symbol period before completing processing, by the encoder, of all of the plurality of sets of input bits.

In some examples of the method, apparatus, and non-transitory computer-readable medium described above, an initial state of each of the plurality of sets of output bits may be determined based at least in part on one or more input bits from one of the plurality of sets of input bits or an initial encoder state.

In some examples of the method, apparatus, and non-transitory computer-readable medium described above, the plurality of transmission symbol periods comprise contiguous transmission symbol periods.

In some examples of the method, apparatus, and non-transitory computer-readable medium described above, at least one of the plurality of sets of input bits comprises a different number of bits than at least one other of the plurality of sets of input bits.

Some examples of the method, apparatus, and non-transitory computer-readable medium described above may further include processes, features, means, or instructions for pausing the processing after outputting the first set of output bits to wait for the second set of input bits to be received at the encoder.

In some examples of the method, apparatus, and non-transitory computer-readable medium described above, the processing of the plurality of sets of input bits comprises: applying a convolutional code, tail-biting convolutional code, LDPC code, or turbo code to generate the plurality of sets of output bits.

DETAILED DESCRIPTION

The described aspects relate to coding to improve transmission and reception processing time. Encoding of an input vector may begin prior to all bits of the input vector becoming available at the encoder. The encoder may output multiple sets of output bits, where each set of output bits corresponds to a set of input bits of the input vector. In some cases, the encoder may output a set of output bits prior to all bits of the input vector becoming available at the encoder. For a first set of output bits, the encoder may be initialized to a known state (e.g., where the encoder is a CC based encoder), while for subsequent sets of output bits, the encoder may be initialized based on one or more bits of a prior input vector. Each set of output bits may be individually processed for transmission in a transmission time interval or transmission symbol period. For example, a set of output bits may be separately interleaved and/or rate-matched to resources of the transmission time interval or transmission symbol period.

According to some aspects, a decoding delay may be reduced using a sliding-window for Viterbi decoding. A Viterbi decoder may identify path metrics over a sliding window, and employ back-tracking at each stage to generate hard decision bits for the trailing stage of the sliding window. The sliding window moves forward as additional branch metrics are available. The overall decoding delay is reduced as the complete trellis does not need to be back-tracked after the last input stage is received.

Aspects of the disclosure may increase performance in systems desiring or requiring high reliability and/or low latency traffic, for example traffic in ultra-reliable low latency communication (URLLC) systems. In some examples, latency for the transmission of data traffic may be reduced by beginning an encoding process for a set of data even before the complete set of data to be encoded is received at the encoder. In other examples, certain portions of a control message may be available for encoding, and received at the encoder, prior to other portions of a control message. It may be desirable to include the complete control message in a single codeword, and reduce latency. According to one or more aspects, portions of the control message to be encoded into a single codeword may commence encoding prior to the entire control message being available for encoding at the encoder, but the encoder may still be capable of generating a single encoded codeword for the entire control message.

Aspects of the disclosure are initially described in the context of a wireless communications system. Aspects of the disclosure are then described with reference to encoding configurations and processes. Aspects of the disclosure are further illustrated by and described with reference to apparatus diagrams, system diagrams, and flowcharts that relate to coding to improve transmission and reception processing time.

Figure 1:
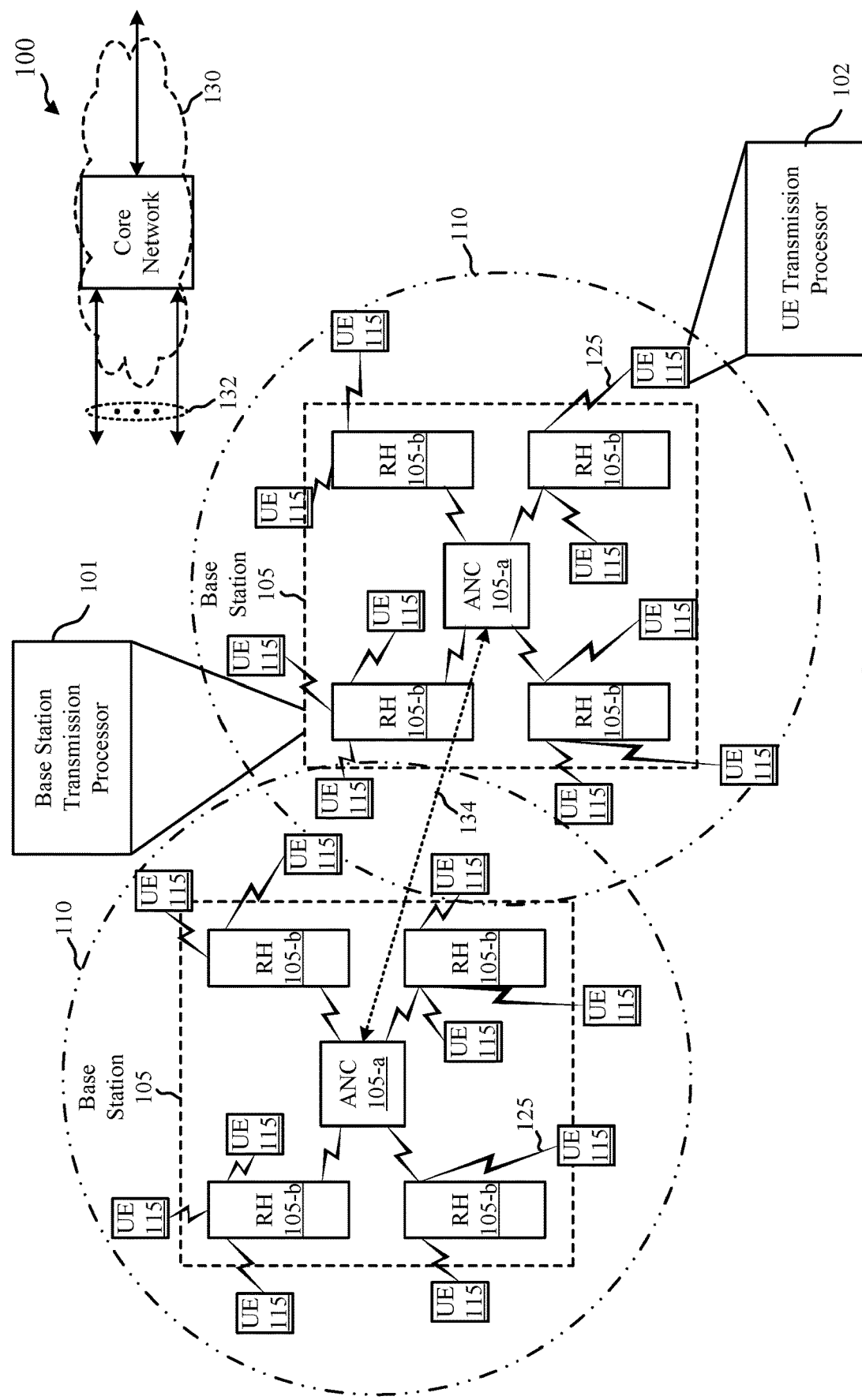
FIG. 1 illustrates an example of a wireless communications system that supports enhanced coding to improve transmission and reception processing time in accordance with one or more aspects of the present disclosure.

FIG. 1 illustrates an example of a wireless communications system 100 that supports enhanced coding to improve transmission and reception processing time in accordance with one or more aspects of the present disclosure. The wireless communications system 100 includes base stations 105, UEs 115, and a core network 130. In some examples, the wireless communications system 100 may be an LTE, LTE-Advanced, new radio (NR), or 5G network. In NR or 5G networks, the base stations 105 may include access nodes (ANs), central units (CUs), and/or distributed units (DUs). An AN may be an example of a new radio base station (NR BS), a new radio Node-B (NR NB), a network node (NN), or the like. A CU may be an example of a central node (CN), an access node controller 105-$a$ (ANC), or the like. Each of the DUs may be an example of an edge node (EN), an edge unit (EU), a radio head 105-$b$ (RH), a smart radio head (SRH), a transmission and reception point (TRP), or the like. The UEs 115, base stations 105, and other devices of wireless communications system 100 may have low-latency encoders that output codeword bits for transmission prior to loading all input bits. A base station 105 may include a base station transmission processor 101, and a UE 115 may include a UE transmission processor 102. These may be examples of a transmission processor 915, 1015, or 1115 as described with reference to FIGS. 9 through 11.

Base stations 105 (e.g., using ANCs 105-$a$) may wirelessly communicate with UEs 115 via one or more RHs 105-$b$, with each RH 105-$b$ having one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

In some cases, a base station 105 and a UE 115 may communicate using carrier frequencies at 6 GHz or less (sub-6), or higher such as 28 GHz, 60 GHz, etc. which is also known as millimeter wave communications. Each component can have a bandwidth of, e.g., 1.4, 3, 5, 10, 15, 20 MHz, etc. In some cases, a base station 105 and a UE 115 may communicate using more than one carrier in a carrier aggregation (CA) configuration. Each aggregated carrier is referred to as a component carrier. In some cases, the number of component carriers can be limited to, e.g., a maximum of five 20 MHz carriers, giving maximum aggregated bandwidth of 100 MHz. In frequency division duplexing (FDD), the number of aggregated carriers can be different in downlink and uplink. The number of uplink component carriers may be equal to or lower than the number of downlink component carriers. The individual component carriers can also be of different bandwidths. For time division duplexing (TDD), the number of component carriers as well as the bandwidths of each CC will normally be the same for downlink and uplink. Component carriers may be arranged in a number of ways. For example, a carrier aggregation (CA) configuration may be based at least in part on contiguous component carriers within the same operating frequency band, i.e., called intra-band contiguous CA. Non-contiguous allocations can also be used, where the component carriers may be either be intra-band, or inter-band.

Within a CA configuration, certain component carriers may be configured differently from other component carriers of the CA configuration. For example, the CA configuration may include a primary component carrier (PCC or PCell) and one or several secondary component carriers (SCC or SCell). The PCell may be configured to carry uplink and downlink control information on a physical uplink control channel (PUCCH) and a physical downlink control channel (PDCCH) or enhanced PDCCH (ePDCCH), respectively. PDCCH on a PCell may include scheduling information for resources of the PCell or for resources of one or more SCells, or both. An SCell may include PDCCH, which may include scheduling information for resources of that SCell or for one or more other SCells. Some SCells may be configured for downlink communications and may not be configured for uplink communications, while a PCell may be configured for both uplink and downlink communications. Various carriers of the CA may be TDD or FDD configured. A CA configuration may include both TDD and FDD configured carriers.

In some cases, wireless communications system 100 may utilize enhanced component carriers (eCCs). In some examples, NR or 5G networks may utilize eCCs, and the use of eCCs over a shared spectrum may be referred to as New Radio for Shared Spectrum (NR-SS). An SCell may, for instance, be an eCC. An eCC may be characterized by one or more features including: wider bandwidth, shorter symbol duration, shorter transmission time intervals (TTIs), and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power). In some cases, an eCC may utilize a different symbol duration than other component carriers, which may include use of a reduced symbol duration as compared with symbol durations of the other component carriers. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

In some environments, reducing or minimizing system latency may be an important system performance factor. However, input bits of a single input vector may become available at different times. For example, an input vector may include information bits and check bits, where some or all information bits may be generated by or received from different sources. In addition, the check bits may not be available until sometime after all of the information bits are available. The input vector may be, for example, a physical channel message (e.g., control channel message). Additionally or alternatively, a codeword corresponding to a single input vector may not be transmitted in a single symbol period. For example, a physical channel message may span multiple symbol periods of a transmission.

System performance of transmission of information bits in low-latency environments may be determined by factors such as overhead, coding gain, transmission pipelining, and decoding delay. Some processing techniques may emphasize improving transmission pipelining and decoding delay at the expense of higher overhead and lower coding gain. Generally, use of larger encoded codewords reduces overhead and provides higher coding gain. However, larger encoded codewords may result in a larger decoding delay and overall system latency. In contrast, use of smaller encoded codewords may reduce latency or decoding delay but result in an increase in overhead and lower coding gain.

Components of the wireless communications system 100 including the base stations 105 or UEs 115 may implement enhanced coding techniques to improve transmission and reception processing time. Encoding of an input vector may begin prior to all bits of the input vector becoming available at the encoder. The encoder may output multiple sets of output bits, where each set of output bits corresponds to a set of input bits of the input vector. For a first set of output bits, the encoder may be initialized to a known state, while for subsequent sets of output bits, the encoder may be initialized based on one or more bits of a prior input vector. Each set of output bits may be individually processed for transmission in one or more transmission symbol periods, which may be a subset of a TTI. For example, each of multiple sets of output bits may be separately interleaved and/or rate-matched to resources of corresponding transmission symbol periods. An input vector includes information bits associated with a single message and may include check bits (e.g., CRC bits) used to implement a checking function. The encoder may implement, for example, a terminated CC, TBCC, turbo code, LDPC, and the like.

In some examples, decoding delay for components of the wireless communications system 100 including the base stations 105 or UEs 115 may be reduced using a sliding-window for Viterbi decoding. A Viterbi decoder may identify path metrics over a sliding window, and employ back-tracking at each stage to generate hard decision bits for the trailing stage of the sliding window. The sliding window moves forward as additional branch metrics are available. The overall decoding delay is reduced as the complete trellis does not need to be back-tracked after the last input stage is received.

Figure 2:
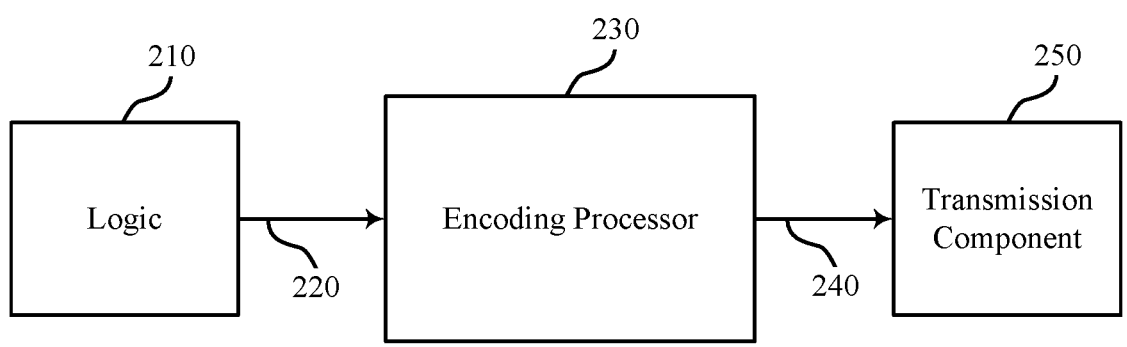
FIG. 2 illustrates an example of a configuration that supports enhanced coding to improve transmission and reception processing time in accordance with one or more aspects of the present disclosure.

FIG. 2 illustrates an example of a configuration 200 for enhanced coding to improve transmission and reception processing time, in accordance with one or more aspects of the present disclosure. Configuration 200 may include logic 210, encoding processor 230, and transmission component 250. Configuration 200 may be included in a transmitting wireless device, and may be an example of aspects of one or more of the base stations 105 or the UEs 115 as described with reference to FIG. 1.

Logic 210 may include an intelligent hardware device, such as a central processing unit (CPU), a microcontroller, an application specific integrated circuit (ASIC), etc. Logic 210 may determine input bits 220 to transmit to a receiving wireless device. The receiving wireless device may be a UE or base station, which may be examples of UEs 115 or base stations 105 as described with reference to FIG. 1. As one example, logic 210 may be used by a base station 105 to determine specific information bits associated with a physical channel message (e.g., data bits, control bits, etc.) to send to a UE 115. The input bits 220 may include both the information bits and CRC bits associated with those information bits. In some examples, logic 210 may receive information bits, organize such information bits, and generate CRC bits associated with the information bits. In some case, logic 210 may organize the input bits 220 as a single input vector made up of multiple sets of input bits 220.

The sets of input bits 220 of the single input vector may be available at the output of logic 210 at the same time. However, availability for the sets of input bits 220 may also be non-concurrent. For example, some of the specific information bits may depend on feedback received from a receiving device (e.g., a UE 115, where the transmitting device is a base station 105). Logic 210 may perform response processing on the received feedback, and continue to append input bits 220 of the single input vector after at least a portion of input bits 220 are ready. Thus, the specific information bits may be determined by logic 210 over a time period, which may correspond, for example, to multiple transmission symbol periods. The time period may be, for example, a TTI including multiple symbol periods, one or more subframes, one or more slots, etc.

For example, base station 105 may receive multiple different sets of feedback (e.g., acknowledgement (ACK) or non-acknowledgement (NAK) information) from a UE 115, over a period of time, that are used by logic 210 to determine input bits 220. Logic 210 may determine a portion (e.g., a set) of the total number of information bits individually based on each set of feedback received from UE 115. Therefore, the total number of input bits 220 that are associated with the same physical channel message may be broken up into multiple different input bit sets and made available by logic 210 to encoding processor 230 at different times. Additionally or alternatively, each of the sets of input bits 220 may be associated with transmission during a transmission symbol period. For example, a single input vector may be transmitted over multiple transmission symbol periods.

Encoding processor 230 may encode input bits 220 to transmit to a wireless device. In some examples, a base station 105 may use encoding processor 230 to encode input bits 220 determined by logic 210. Encoding processor 230 may perform an encoding process (e.g., convolutional coding, tail-biting convolutional coding, LDPC coding, turbo coding, etc.). In some cases, only a portion of the total number of input bits 220 may be encoded at a given time (e.g., due to feedback from a UE 115, processing time, etc.). As an example, after encoding a subset of the input bits 220 from a single input vector at a given time, encoding processor 230 may output the output bits of the codeword generated from the subset of the input bits 220 and wait for more input bits 220 of the input vector to become available before continuing the encoding process. In some cases, while encoding processor 230 is encoding a subsequent portion of input bits 220 or waiting for further input bits 220 to be available from logic 210, interleaving and rate matching of the previously encoded bits may occur. For example, interleaving and rate matching may be performed on a subset of the encoded output bits for mapping to resources of a single symbol period. Encoding, interleaving, and rate matching may occur at different times (e.g., for different sets of output bits of the single codeword associated with the input vector). For example, a single CRC may be used for the single input vector, while interleaving and rate matching occurs separately and at different times for different subsets of the output bits associated with the codeword. The encoded, interleaved, and rate matched bits may then be output from encoding processor 230 as processed bits 240.

Transmission component 250 may transmit encoded bits (e.g., processed bits 240 received from encoding processor 230) to a receiving device (e.g., a UE 115 where the transmitting device is a base station 105). In some examples, transmission component 250 may take processed bits 240 made available by encoding processor 230 and perform a number of operations before transmitting to the UE 115. As an example, transmission component 250 may first modulate the processed bits 240, then map the modulated bits to available time-frequency resources (e.g., symbols). Finally, information may be sent to one or multiple antennas that are a part of transmission component 250 for transmission to the UE 115.

In some examples, transmission component 250 may begin wireless transmissions from configuration 200 prior to all input bits 220 of a single input vector having been received by encoding processor 230 and output as processed bits 240. In some examples, transmission component 250 may transmit a first set of processed bits 240 associated with a single input vector in a first transmission symbol before a last input bit of the single input vector is received at encoding processor 230 of configuration 200. In other examples, transmission component 250 may transmit the first set of processed bits 240 associated with a single input vector in a first transmission symbol before a last input bit of a second set of input bits (the second set of input bits immediately following the first set of input bits) of the single input vector is received at encoding processor 230. In still other examples, transmission component 250 may transmit a first set of processed bits 240 associated with the single input vector in a transmission symbol before a first input bit of the second set of input bits is received at encoding processor 230.

In further examples, transmission component 250 may begin wireless transmissions from configuration 200 (e.g., from a transmitting device such as base station 105 or UE 115) prior to all input bits 220 of a single input vector having been processed by encoding processor 230 and output as processed bits 240. In some examples, transmission component 250 may begin wireless transmissions from configuration 200 prior to all input bits 220 (including the last input bit) of a single input vector having been processed by encoding processor 230 and output as processed bits 240. In yet other examples, transmission component 250 may begin transmitting prior to all input bits 220, including the last input bit, of a second set of input bits 220 having been processed. In still other examples, transmission component 250 may begin transmitting prior to a first bit of a second set of input bits 220 having been processed by encoding processor 230 and output as processed bits 240, the second set of input bits of the single input vector immediately following the first set of input bits of the single input vector.

Figure 3:
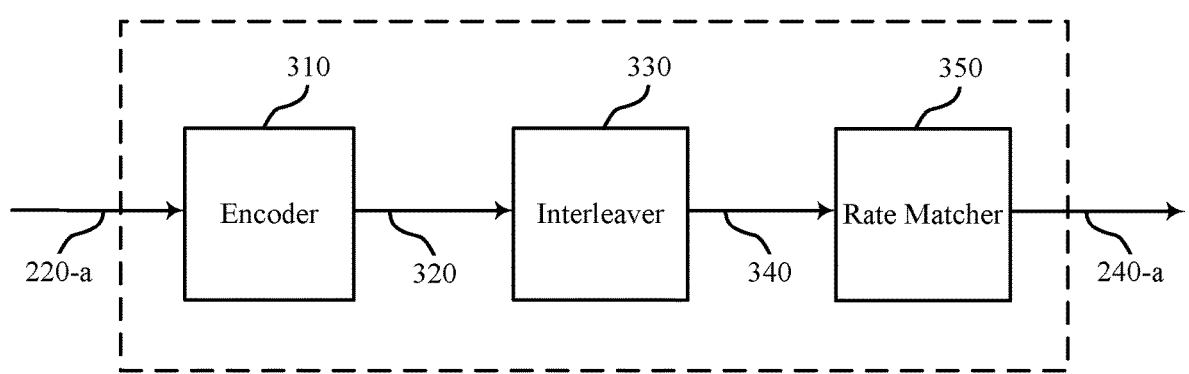
FIG. 3 illustrates an example of an encoding processor that supports enhanced coding to improve transmission and reception processing time in accordance with one or more aspects of the present disclosure.

FIG. 3 illustrates an example of an encoding processor 300 for enhanced coding to improve transmission and reception processing time, in accordance with one or more aspects of the present disclosure. Encoding processor 300 may be an example of encoding processor 230 as described with reference to FIG. 2. Encoding processor 300 may include encoder 310, interleaver 330, and rate matcher 350. In some cases, encoding processor 300 may include a plurality of different components used to perform aspects of an encoding process. The different components may be included in encoding processor 300 in an order as illustrated in FIG. 3 and as described below, or the components may have a different order or configuration. For example, rate matcher 350 may follow encoder 310, while interleaver 330 may follow rate matcher 350, or interleaver 330 may be a part of rate matcher 350, and interleaving may be performed as part of a rate matching process.

Encoding processor 300 may include encoder 310, which may perform a first operation in an encoding process. Encoder 310 may begin encoding (e.g., convolutional coding, tail-biting convolutional coding, LDPC coding, turbo coding, etc.) as input bits 220-a become available. Input bits 220-a may be an example of input bits 220 as described with reference to FIG. 2. For example, an encoder may receive a portion (e.g., a set) of the total number of input bits 220-a and begin encoding that set of input bits 220-a. After encoding the available input bits 220-a, encoder 310 may pause encoding to wait for more input bits 220-a to become available. Encoder 310 may also pause encoding the input bits 220-a prior to completing encoding, for example because the encoder may apply a sliding or shifting operation (e.g., CC) sequentially over the input bits while operating on more than one bit at a time for generating each bit or state output, such that one or more bits from a second portion of input bits 220-a may be used by the encoder to complete encoding the last one or more bits of the first portion of input bits 220-a. In some examples, while encoder 310 waits for more input bits 220-a, the encoded output bits 320 may undergo additional processing in the encoding processor 300, such as interleaving and rate matching.

Interleaver 330 may produce interleaved bits 340 from encoded output bits 320. In some cases, interleaver 330 may perform an interleaving process to reduce the impact of burst errors, for example by increasing the likelihood that a burst error may be successfully corrected by a CRC process at a receiving device.

In some examples, a set of output bits associated with a single symbol period may be interleaved with other bits of the same set of output bits, but independent of other sets of output bits. For example, the bits for transmission in a single symbol period may be interleaved with other bits for transmission within that same symbol period, but not with bits of other symbol periods, even if the bits of other symbol periods are associated with the same single input vector that is being processed.

Rate matcher 350 may perform a rate matching process on interleaved bits 340. In some cases, the rate matching process may include rate matcher 350 matching a number of bits to be transmitted (e.g., interleaved bits 340) to transmission resources allocated for transmitting the bits as processed bits 240-a. Processed bits 240-a may be an example of processed bits 240 as described with reference to FIG. 2. Rate matching may include one or more of puncturing, repetition, or pruning.

In some examples, the amount of resources available in each symbol period (e.g., of a TTI, slot, or subframe) may be different. In some examples, rate matcher 350 may match a single set of processed bits 240 to match the resources available in a single symbol period of a transmission. In some cases, a single input vector may be partitioned into sets of input bits 220-a that are differently sized (e.g., by logic 210 as discussed with reference to FIG. 2) so that each set of interleaved bits 340 may be rate matched at the same rate (e.g., substantially the same rate) into each symbol period by rate matcher 350. Logic 210 may obtain information regarding the amount of resources available in a symbol period of a transmission when dividing the single input vector into sets of input bits 220-a.

In other cases, the single input vector may be partitioned into uniformly-sized (e.g., substantially uniformly-sized) sets of input bits 220-a, such that each set of interleaved bits 340 are correspondingly uniformly-sized (e.g., substantially uniformly-sized). Rate matcher 350 may then perform different levels of rate matching from symbol to symbol on the interleaved bits 340 to match the interleaved bits 340 to the amount of resources available in a given symbol period. Thus, rate matcher 350 may use information regarding the amount of resources available in a symbol to be transmitted when performing rate matching, while logic 210 may not use such information.

Figure 4:
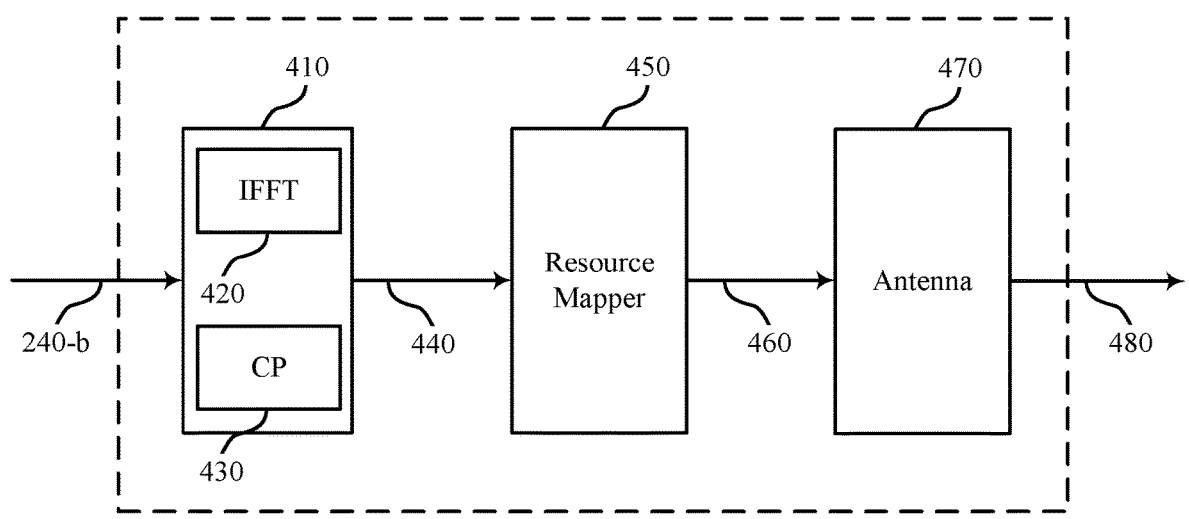
FIG. 4 illustrates an example of a transmission component that supports enhanced coding to improve transmission and reception processing time in accordance with one or more aspects of the present disclosure.

FIG. 4 illustrates an example of a transmission component 400 for coding to improve transmission and reception processing time, in accordance with one or more aspects of the present disclosure. Transmission component 400 may be an example of transmission component 250 as described with reference to FIG. 2. Transmission component 400 may include a modulator 410, resource mapper 450, and antenna 470. In some cases, transmission component 400 may include a plurality of different components used to perform aspects of a transmission process. The different components may be included in transmission component 400 in an order as illustrated in FIG. 4 and as described below, or the components may have a different order or configuration.

Modulator 410 may modulate the processed bits 240-b. Information bits output from an encoding process (e.g., information bits that may be encoded, interleaved, and rate matched) may be made available to modulator 410 as processed bits 240-b. Processed bits 240-b may be an example of processed bits 240 or 240-a as described with reference to FIGS. 2 and 3. In some cases, modulator 410 may modulate the processed bits 240-b according to a specific modulation scheme (e.g., quadrature phase shift keying (QPSK), 16 quadrature amplitude modulation (16-QAM), etc.). Modulated information 440 may then be output by modulator 410.

Modulator 410 may include a number of different components used to perform specific tasks. For example, modulator 410 may include inverse fast Fourier transform (IFFT) component 420. IFFT component 420 may be used by modulator 410 to convert information bits from a frequency domain representation to a time domain representation. Modulator 410 may also include cyclic prefix (CP) component 430. In some cases, CP component 430 may be used by modulator 410 to add a CP to a transmission. The CP may have a predetermined length (e.g., an extended length or normal length) and be used to provide protection against multi-path delay spread. As an example, CP component 430 may generate a CP for a transmission by copying the end of the main body of a symbol (e.g., an orthogonal frequency division multiplexing (OFDM) symbol) to the beginning of the symbol.

Resource mapper 450 may map the modulated information 440 (e.g., symbols) to available time-frequency resources in a transmission process. For example, resource mapper 450 may first receive modulated information 440 that is output by modulator 410. Resource mapper 450 may then map the modulated information 440 to available resources in preparation for transmission. In some cases, resource mapper 450 may map the modulated information 440 that is associated with a set of information bits to a symbol. The output of resource mapper 450 may be referred to as mapped information 460.

Antenna 470 may perform aspects of a transmission process for a wireless device. In some cases, transmission component 400 may include a single antenna 470 or multiple antennas 470. As an example, a base station 105 may include multiple antennas 470 which may be capable of concurrently transmitting or receiving multiple wireless transmissions. Multiple antennas 470 may receive mapped information 460 from resource mapper 450 and send a transmission 480 to a receiving device (e.g., a UE 115 when transmission component 400 is part of the base station 105). Transmission 480 may contain all or a portion of a message (e.g., a set of encoded information bits associated with a larger codeword).

Figure 5:
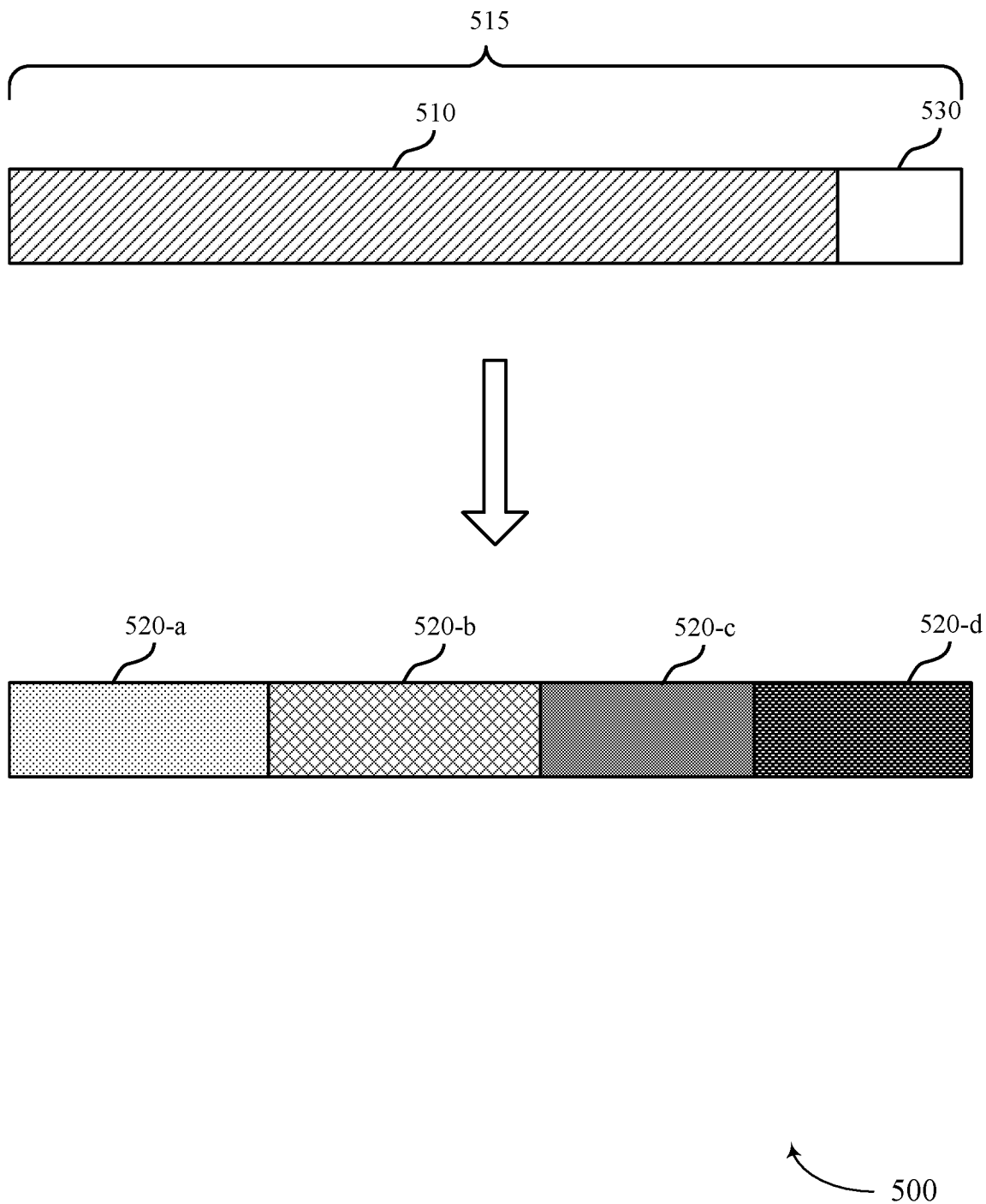
FIG. 5 illustrates an example of a single input vector that supports enhanced coding to improve transmission and reception processing time in accordance with one or more aspects of the present disclosure.

FIG. 5 illustrates an example diagram 500 for coding to improve transmission and reception processing time, in accordance with one or more aspects of the present disclosure. In an example, a base station 105 may desire to transmit a single input vector 515 to a UE 115, or the UE 115 may desire to transmit a single input vector 515 to the base station 105. The single input vector 515 may be associated with a single physical channel message. The single input vector 515 may be encoded during a process into a single codeword (e.g., a process such as encoding process 600 as described with reference to FIG. 6 below).

In some examples, the single input vector 515 may include information bits 510. Single input vector 515 may also include a CRC portion 530. In some examples, the single input vector 515 may include multiple CRC portions, which may be at intermediate positions within the single input vector 515. CRC portion 530 may, for example, provide redundancy to single input vector 515 and assist with error detection and correction. CRC portion 530 may include a number of bits that may be used to indicate redundancy information for all of the information bits 510. In some examples, single input vector 515 may be interleaved, such that the CRC portion 530 may be interleaved among information bits 510.

Prior to encoding, the single input vector 515 may be divided into multiple input bit sets 520. In an example, the single input vector 515 may include a first input bit set 520-a, a second input bit set 520-b, a third input bit set 520-c, and a fourth input bit set 520-d. In some examples, each input bit set 520-a may correspond to a single time period of a transmission (e.g., a transmission symbol period). It may be advantageous to transmit the bits of single input vector 515 together in a single encoded codeword, rather than encoding a codeword for each input bit set to be separately transmitted for the reasons described above (e.g., higher coding gain). However, it may also be advantageous to begin encoding the first input bit set 520-a when it arrives at an encoding processor (e.g., encoding processor 230 or 300, as described with reference to FIGS. 2 and 3) for a shorter decoding delay. In this way, the first input bit set 520-a may be encoded before a later input bit set 520 (e.g., the fourth input bit set 520-d) is received at the encoding processor.

A single input vector 515 may be partitioned (e.g., by logic 210) into multiple bit sets for processing based in part on the amount of resources available in a symbol in which the processed bit sets will be sent. For example, single input vector 515 may be partitioned into a first input bit set 520-a, a second input bit set 520-b, a third input bit set 520-c, and a fourth input bit set 520-d based in part on the amount of resources available in each of the respective symbol periods in which processed bits will be sent. In such case the first input bit set 520-a, second input bit set 520-b, third input bit set 520-c, and fourth input bit set 520-d may be of different bit length. In other examples, single input vector 515 may be partitioned into uniformly sized portions of bits. For example, single input vector 515 may be partitioned into a first input bit set 520-a, a second input bit set 520-b, a third input bit set 520-c, and a fourth input bit set 520-d, each having the same bit length. Processed bits, based on the input bit sets, may then be rate matched individually into the resources of each symbol period used for transmission.

Figure 6:
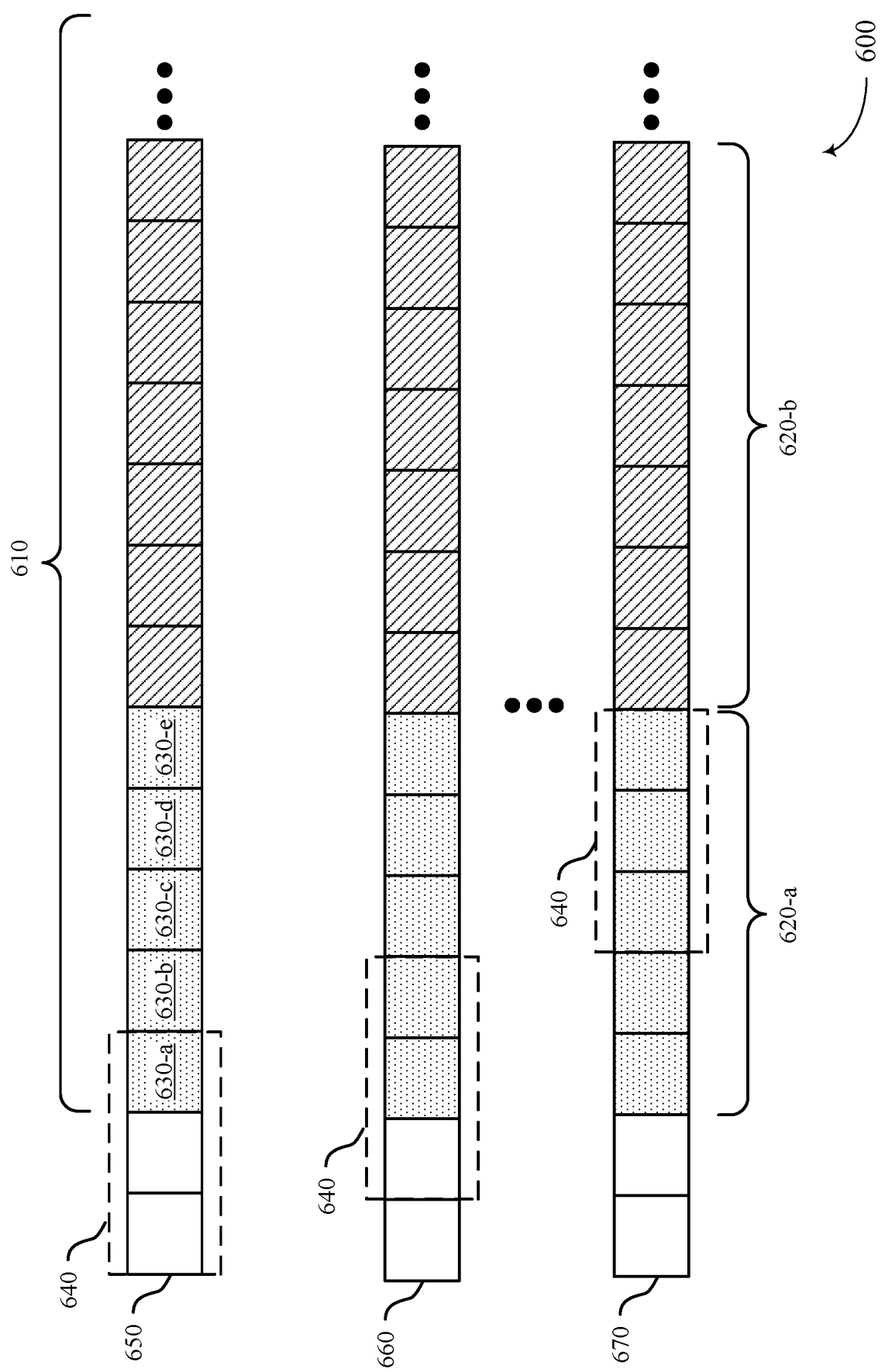
FIG. 6 illustrates an example of an encoding process that supports coding to improve transmission and reception processing time in accordance with one or more aspects of the present disclosure.

FIG. 6 illustrates an example of encoding process 600 for enhanced coding to improve transmission and reception processing time, in accordance with one or more aspects of the present disclosure. In some cases, the encoding process may be performed by encoding processor 230 or encoding processor 300 as described with reference to FIGS. 2 and 3.

As an example, encoding process 600 may be used to encode single input vector 610, which may be an example of a single input vector 515 as described with reference to FIG. 5, into a single codeword. Single input vector 610 may be associated with a physical channel message (e.g., a control channel message) and may include one or more information bits and/or CRC bits. Logic 210, as described with reference to FIG. 2, may be used to determine single input vector 610 for transmission, and make bits associated with the single input vector 610 available to an encoding processor.

In some cases, single input vector 610 may be divided up into a number of different input bit sets 620. For example, different input bit sets 620 may be made available at different times to encoding process 600 (e.g., due to feedback from a UE 115, processing time, etc.).

First input bit set 620-a may include a number of bits 630 (e.g., bits 630-a, 630-b, 630-c, 630-d, and 630-e) that are associated with a first portion of single input vector 610 made available at a first time period to encoding process 600, while second input bit set 620-b may include a number of bits that are associated with a second portion of single input vector 610 and made available at a subsequent time period to encoding process 600.

Encoding process 600 may use window 640 to generate output bits for the codeword. Window 640 may have a predetermined size (e.g., 3 input bits as illustrated in FIG. 6), which may be based on the constraint length of the code. In some cases, the input to the encoding process 600 is a single input vector (e.g., single input vector 610) determined by logic 210. Encoding may commence before all input bits or input bit sets 620 associated with single input vector 610 are available. That is, encoding process 600 may start as soon as first input bit set 620-a is made available, even if other input bit sets 620 that make up single input vector 610 (e.g., second input bit set 620-b) are not yet available.

A shift register may be initialized (e.g., all bits set to 0 or another predetermined state) and at operation 650 first bit 630-a of single input vector 610 (which may be a first bit of first input bit set 620-a) may be an input to the shift register. Window 640 may be used to generate a number of encoded output bits associated with the information in the shift register. In some cases, the number of input bits is associated with a constraint length of the shift register. Additionally or alternatively, output bits may be interleaved and rate matched as they are output from the encoder, or a device may wait for a number of encoded bits to be output (e.g., all of the output bits associated with a certain input bit set 620) before performing interleaving and rate matching (e.g., rate matching and interleaving may occur on a per symbol or per bit set basis, such as for input bit set 620).

Operation 660 may be a second operation of encoding process 600. At operation 660, second bit 630-b of single input vector 610 may be input to a shift register to output a next output bit. Subsequent bits 630 of the input bit set 620-a of single input vector 610 may then be input to the shift register and subsequent output bits generated.

Operation 670 of encoding process 600 may occur a number of operations after operation 660. At operation 670, last bit 630-e associated with first input bit set 620-a, may be input to the shift register (e.g., the 3 stage shift register). In some cases, second input bit set 620-b may not yet be available to encoding process 600 at the time that last bit 630-e associated with first input bit set 620-a has been input to the shift register. In such a case, encoding process 600 may stop and wait (e.g., pause) for the arrival of second input bit set 620-b before resuming, so that the first input bit of the second input bit set 620-b may be input into the shift register. In some examples, while encoding process 600 is waiting for the arrival of a second input bit set 620-b associated with single input vector 610, rate matching and interleaving may be performed on the already-generated output bits associated with first input bit set 620-a. In further examples, modulation and transmission of the already generated output bits may also occur during the waiting period. To complete the encoding process for the single input vector 610, known bits 630 may be provided to the shift register after the last input bit from the final input bit set 620 has been input to the shift register. For example, in the case of the 3 stage shift register, two known bits 630 (e.g., bits 630-a and 630-b) may be input into the shift register after the last input bit from the final input bit set 620. This may allow the shift register to fully encode the last input bit from the final input bit set 620. By providing termination states to the shift register, the encoder may output the final output bit or bits.

Aspects of the encoding process may be performed by various different encoding techniques (e.g., convolutional coding, tail-biting convolutional coding, LDPC coding, turbo coding, etc.). For example, if tail-biting convolutional coding is used, a number of bits of single input vector 610 may be stored and appended at the end of an information bit-stream (e.g., at the end of single input vector 610). In such a case, encoding process 600 may not begin until a number of bits are input into a shift register and may not stop when the last information bits are input to the shift register. For example, in the case of the 3 stage shift register, encoding process 600 may begin when the first three bits of single input vector 610 are input into the shift register, and the first two bits of single input vector 610 may be stored and appended at the end of single input vector 610.

Figure 7:
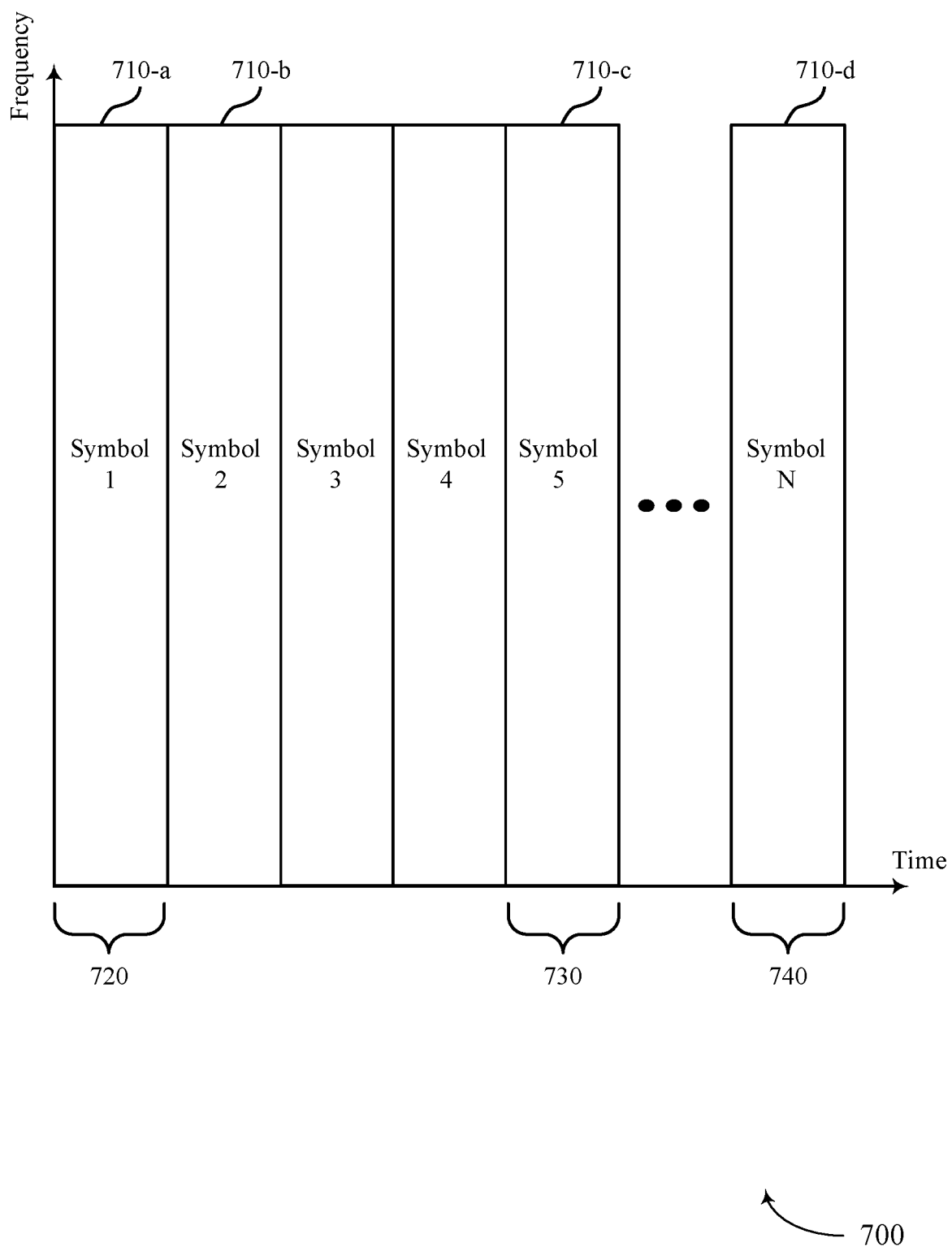
FIG. 7 illustrates an example of resources that supports enhanced coding to improve transmission and reception processing time in accordance with one or more aspects of the present disclosure.

FIG. 7 illustrates an example of resources 700 for enhanced coding to improve transmission and reception processing time, in accordance with one or more aspects of the present disclosure. Resources 700 may be distributed over time and frequency resources and may be an example of a TTI, slot, or subframe.

Resources 700 may be divided up into a number of symbols 710, including symbols 1 through N (e.g., 7 symbols), for example by resource mapper 450 as described with reference to FIG. 4. During the symbol period for a symbol 710, resource mapper 450 or a similar device may allocate a number of subcarriers (e.g., 12, 48, 72, 512, 1024, 2048, etc.) of a carrier for transmission. In some cases, transmission of information such as a codeword (e.g., generated as a result of encoding process 600 as described with reference to FIG. 6) for a single input vector may occur over multiple symbols 710. Each portion of the encoded codeword may be transmitted in a separate symbol 710. In some examples, a single codeword may be transmitted in a single symbol period, and may occupy fewer than all the resources of the symbol period.

In some cases, a first transmission portion 720 for the codeword may occur in first symbol 710-a of resources 700. The first transmission portion 720 may be for a first set of bits output from an encoder. In some examples, the first transmission portion 720 may be separately interleaved, rate matched, modulated, etc., from subsequent transmission portions. For example, bits of first transmission portion 720 within symbol 710 may be interleaved with other bits of first transmission portion 720, but independent of any bits of transmission portions within other symbols, such as a second transmission portion 730. As an example, first transmission portion 720 may include a first portion of a codeword as described with reference to FIG. 6.

Second transmission portion 730 for the codeword may occur in a subsequent symbol 710 of resources 700. The second transmission portion 730 may be for a second set of bits output from the encoder (e.g., after interleaving, rate matching, modulation, etc.). In some cases, the second transmission portion 730 may be sent in second symbol 710-b of resources 700 (which may immediately follow first symbol 710-a) or the second transmission portion 730 may be sent in later symbol 710-c (which may occur a number of symbols after first symbol 710-a). One or more subsequent transmission portions may follow until a last transmission portion 740 of the codeword in a symbol 710, such as symbol 710-d, of resources 700. During transmission portion 740, a final portion of the codeword may be transmitted.

Figure 8:
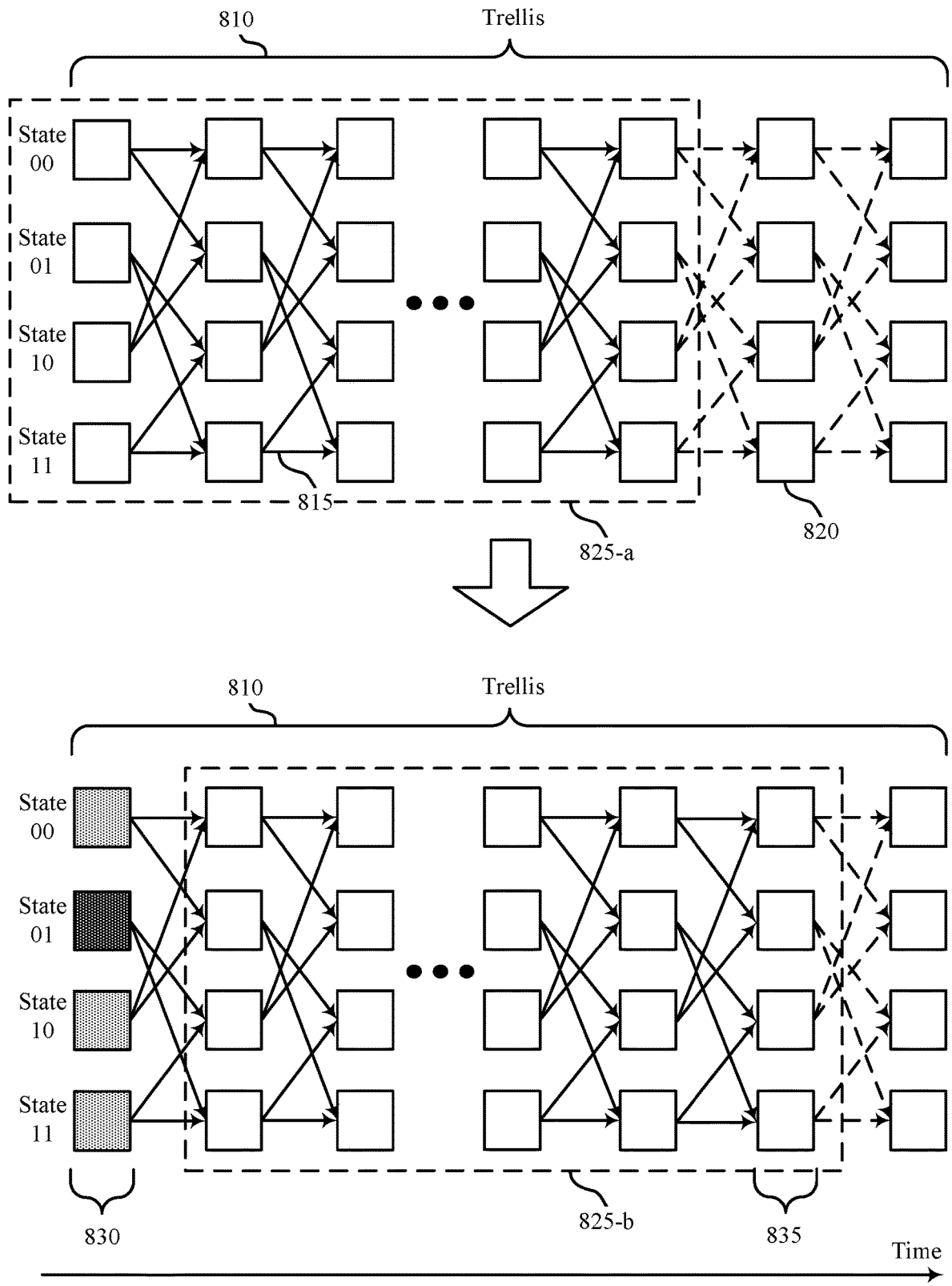
FIG. 8 illustrates an example of a sliding window based Viterbi decoding process that supports enhanced coding to improve transmission and reception processing time in accordance with one or more aspects of the present disclosure.

FIG. 8 illustrates an example of a sliding window based Viterbi decoding process 800 for coding to improve transmission and reception processing time, in accordance with one or more aspects of the present disclosure. Trellis 810 represents transitions 815 between the various possible states 820 of an encoder as a function of time. In FIG. 8, states 820 are represented by boxes and transitions 815 by arrows between states 820. Each state 820 (e.g., state 00, state 01, state 10, and state 11) at a particular time is represented by a row in the trellis 810. For example, every box in the top row of the trellis 810 represents state 00. A path is made up of a series of transitions 815 between states 820. The possible codewords are represented by paths through the trellis 810. For a Viterbi decoder, as symbols are received, a metric associated with a distance between the symbols that were received and the possible symbols may be calculated. In the sliding window based Viterbi decoding process 800, a finite sized trellis window 825 may be used to decode bits, frames, or other sets of data within the trellis window. The finite sized trellis window 825 shifts to the right as an encoded codeword is received and decoded. The codeword may be encoded according to the encoding processes described above with reference to FIGS. 1-7. In this example, finite sized trellis window 825-a may begin to decode the received codeword as it is received and a sufficient number of bits have been received to fill the trellis window. In some examples, the size of the trellis window may be sufficiently small relative to the size of the codeword so that decoding may begin prior to receiving the entire codeword. For example, a codeword may be received in sets of bits to be decoded. Decoding accuracy may be increased by increasing the size of the trellis window, but an increase in the size of the trellis window may increase processing time and also increase the amount of latency until further decoding (e.g., error checking using CRC, etc.) of the received codeword may begin.

For the sliding window based Viterbi decoding process 800 illustrated in FIG. 8, back tracking and decoding may occur with each advance of the finite sized trellis window 825. For one advance of the trellis window, the bits associated with one stage are decoded. Viterbi decoding for the bits that fall within finite sized trellis window 825-*a* may result in a decoded state 830 (i.e., hard decision bits) output (corresponding to one of state 00, state 01, state 10, state 11 as determined by the Viterbi decoding). For example, finite sized trellis window 825-*a* may output a hard decision bit of state 01 for the decoded state 830. The trellis window then proceeds to encompass a new set of states 835 (e.g., finite sized trellis window 825-*a* shifts to become finite sized trellis window 825-*b*). This process continues until the trellis window has advanced to the end of the codeword and the decoder has output the decoded bits. The decoded state 830 for a previous stage may constrain the paths selected by a current back-tracking stage. For example, one or more best paths selected may be constrained to back-track to the decoded state 830 (e.g., state 01).

In this implementation, the codeword corresponds to a single encoded input vector, such that if the encoded codeword is received in sets of bits, the sliding window based Viterbi decoder may output a continuous set of bits associated with the single input vector as sets of bits are received. For example, if a first set of bits from the codeword are received, the decoder may decode those bits, then pause until a second set of bits from the codeword are received, and so on until the end of the codeword.

Figure 9:
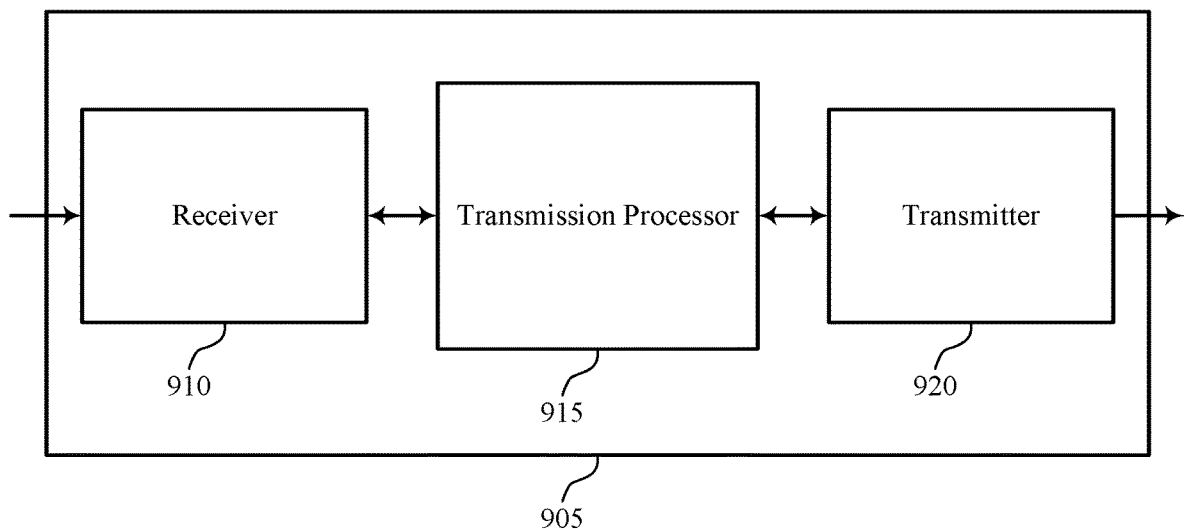
FIGS. 9 through 11 show block diagrams of a device that supports enhanced coding to improve transmission and reception processing time in accordance with one or more aspects of the present disclosure.

FIG. 9 shows a block diagram 900 of a wireless device 905 that supports enhanced coding to improve transmission and reception processing time in accordance with one or more aspects of the present disclosure. Wireless device 905 may be an example of aspects of a UE 115 or base station 105 as described with reference to FIG. 1. Wireless device 905 may include receiver 910, transmission processor 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to coding to improve transmission and reception processing time, etc.). Information may be passed on to other components of the device. The receiver 910 may be an example of aspects of the transceiver 1235 or 1335 as described with reference to FIGS. 12 and 13.

Transmission processor 915 may be an example of aspects of the logic 210, encoding processor 230 or 300, transmission component 250 or 400, base station transmission processor 101 or 1315, and UE transmission processor 102 or 1215 as described with reference to FIGS. 1-4, 12, and 13. Transmission processor 915 and/or at least some of its various sub-components may be implemented in hardware, software executed by a processor, firmware, or any combination thereof. If implemented in software executed by a processor, the functions of the transmission processor 915 and/or at least some of its various sub-components may be executed by a general-purpose processor, a digital signal processor (DSP), an ASIC, an field-programmable gate array (FPGA) or other programmable logic device, discrete gate or transistor logic, discrete hardware components, or any combination thereof designed to perform the functions described in the present disclosure. The transmission processor 915 and/or at least some of its various sub-components may be physically located at various positions, including being distributed such that portions of functions are implemented at different physical locations by one or more physical devices. In some examples, transmission processor 915 and/or at least some of its various sub-components may be a separate and distinct component in accordance with various aspects of the present disclosure. In other examples, transmission processor 915 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Transmission processor 915 may receive, at an encoder of the transmitting device, multiple sets of input bits associated with a single input vector to be encoded into a single codeword, process, by the encoder, the multiple sets of input bits, including a first set of input bits and a second set of input bits, to generate multiple sets of output bits, each set of output bits associated with one of a set of transmission symbol periods, and output, from the encoder, a first set of output bits of the multiple sets of output bits associated with a first transmission symbol period of the set of transmission symbol periods prior to receiving all input bits of the second set of input bits of the multiple sets of input bits, the second set of input bits being received at the encoder subsequent to the first set of input bits.

Transmitter 920 may transmit signals generated by other components of the device. In some examples, the transmitter 920 may be collocated with a receiver 910 in a transceiver module. For example, the transmitter 920 may be an example of aspects of the transceiver 1235 or 1335 as described with reference to FIGS. 12 and 13. The transmitter 920 may include a single antenna, or it may include a set of antennas.

Figure 10:
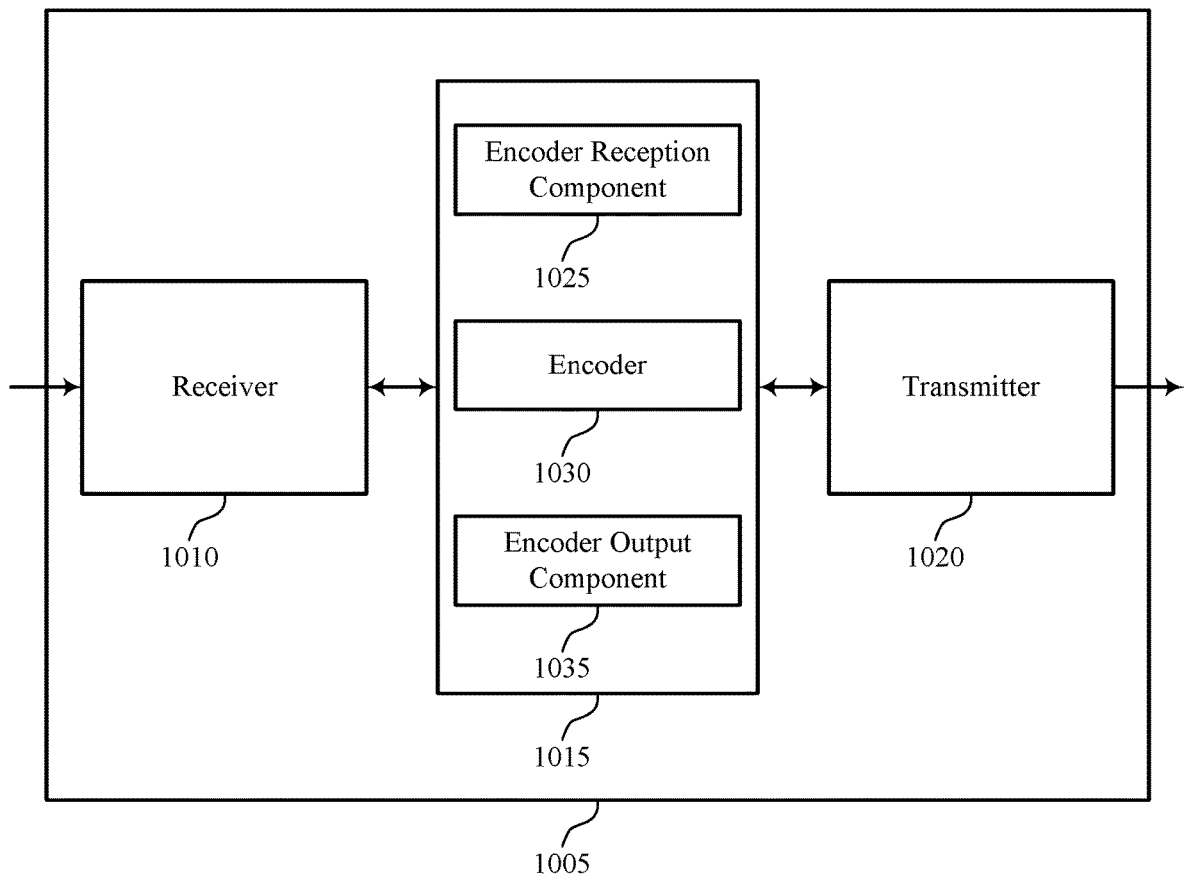

FIG. 10 shows a block diagram 1000 of a wireless device 1005 that supports enhanced coding to improve transmission and reception processing time in accordance with one or more aspects of the present disclosure. Wireless device 1005 may be an example of aspects of a wireless device 905 or a UE 115 or base station 105 as described with reference to FIGS. 1 and 9. Wireless device 1005 may include receiver 1010, transmission processor 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to coding to improve transmission and reception processing time, etc.). Information may be passed on to other components of the device. The receiver 1010 may be an example of aspects of the transceiver 1235 or 1335 as described with reference to FIGS. 12 and 13.

Transmission processor 1015 may be an example of the transmission processor 915 as described with reference to FIG. 9. Transmission processor 1015 may also include encoder reception component 1025, encoder 1030, and encoder output component 1035. Encoder reception component 1025 may be an example of a portion of encoding processor 230 or 300 as described with reference to FIGS.

2 and 3. Encoder 1030 may be an example of a portion of encoding processor 230 or 300 and encoder 310 as described with reference to FIGS. 2 and 3. Encoder output component 1035 may be an example of a portion of encoding processor 230 or 300 as described with reference to FIGS. 2 and 3.

Encoder reception component 1025 may receive multiple sets of input bits associated with a single input vector to be encoded into a single codeword. In some cases, at least one of the multiple sets of input bits includes a different number of bits than at least one other of the multiple sets of input bits.

Encoder 1030 may process the multiple sets of input bits, including a first set of input bits and a second set of input bits, to generate multiple sets of output bits, each set of output bits associated with one of a set of transmission symbol periods. In some cases, an initial state of each of the multiple sets of output bits is determined based on one or more input bits from one of the multiple sets of input bits or an initial encoder 1030 state. In some cases, the set of transmission symbol periods include contiguous transmission symbol periods. In some cases, the processing of the multiple sets of input bits includes: applying a convolutional code, tail-biting convolutional code, LDPC code, or turbo code to generate the multiple sets of output bits.

Encoder output component 1035 may output a first set of output bits of the multiple sets of output bits associated with a first transmission symbol period of the set of transmission symbol periods prior to receiving all input bits of a second set of input bits of the multiple sets of input bits, the second set of input bits being received at the encoder 1030 subsequent to the first set of input bits. Encoder 1030 may pause the processing after outputting the first set of output bits to wait for the second set of input bits to be received at the encoder reception component 1025. In some cases, outputting the multiple sets of output bits is based at least in part on the first set of input bits and the second set of input bits, and is independent of subsequently received sets of input bits being associated with a second input vector to be encoded into a second codeword.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1235 or 1335 as described with reference to FIGS. 12 and 13. The transmitter 1020 may include a single antenna, or it may include a set of antennas.

Figure 11:
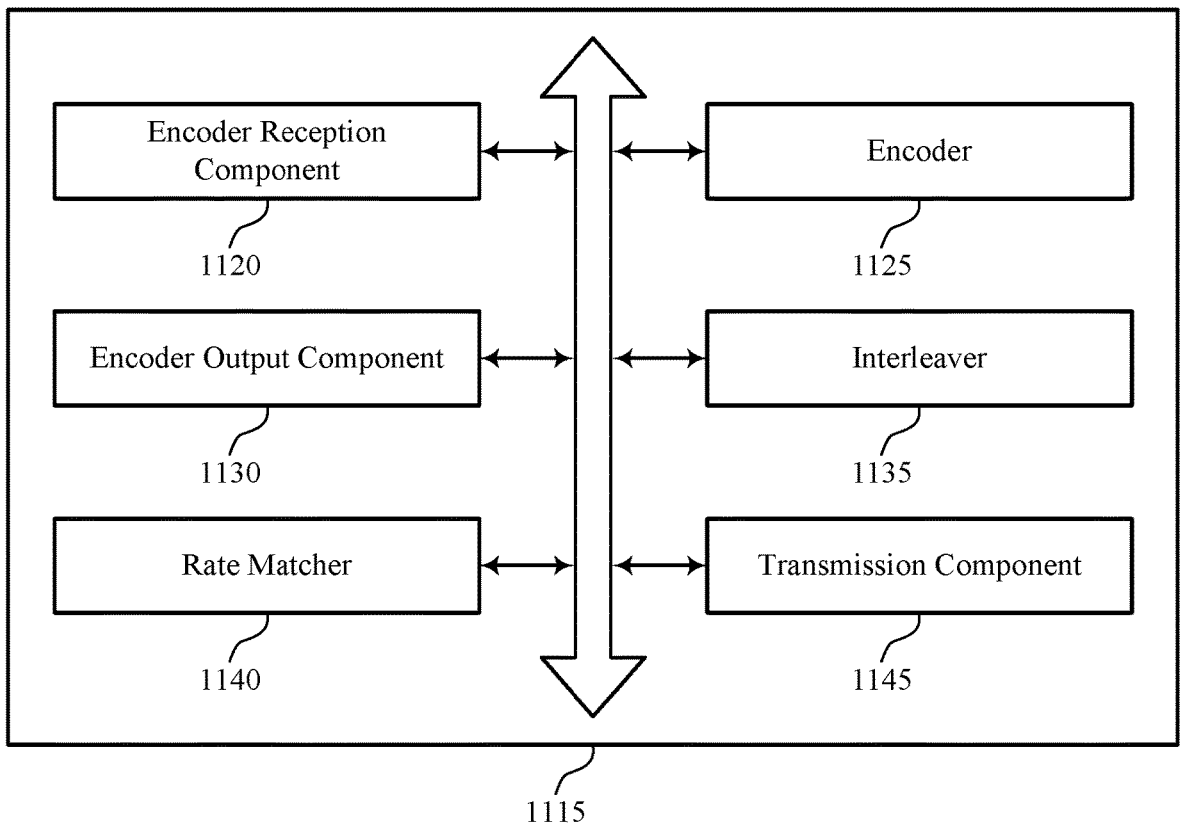

FIG. 11 shows a block diagram 1100 of a transmission processor 1115 that supports enhanced coding to improve transmission and reception processing time in accordance with one or more aspects of the present disclosure. The transmission processor 1115 may be an example of aspects of a transmission processor 915 or 1015, a base station transmission processor 101 or 1315, and a UE transmission processor 102 or 1215 as described with reference to FIGS. 1, 9, 10, 12, and 13. The transmission processor 1115 may include encoder reception component 1120, encoder 1125, encoder output component 1130, interleaver 1135, rate matcher 1140, and transmission component 1145. Each of these modules may communicate, directly or indirectly, with one another (e.g., via one or more buses). Encoder reception component 1120 may be an example of encoder reception component 1025 and a portion of encoding processor 230 or 300 as described with reference to FIGS. 2, 3, and 10. Encoder 1125 may be an example of encoder 1030, encoder 310, and encoding processor 230 or 300 as described with reference to FIGS. 2, 3, and 10. Encoder output component 1130 may be an example of encoder output component 1035 and a portion of encoding processor 230 or 300 as described with reference to FIGS. 2, 3, and 10.

Encoder reception component 1120 may receive multiple sets of input bits associated with a single input vector to be encoded into a single codeword. In some cases, at least one of the multiple sets of input bits includes a different number of bits than at least one other of the multiple sets of input bits.

Encoder 1125 may process the multiple sets of input bits, including a first set of input bits and a second set of input bits, to generate multiple sets of output bits, each set of output bits associated with one of a set of transmission symbol periods. In some cases, an initial state of each of the multiple sets of output bits is determined based on one or more input bits from one of the multiple sets of input bits or an initial encoder (e.g., encoder 1125) state. In some cases, the set of transmission symbol periods include contiguous transmission symbol periods. In some cases, the processing of the multiple sets of input bits includes: applying a convolutional code, tail-biting convolutional code, LDPC code, or turbo code to generate the multiple sets of output bits.

Encoder output component 1130 may output a first set of output bits of the multiple sets of output bits associated with a first transmission symbol period of the set of transmission symbol periods prior to receiving all input bits of the second set of input bits of the multiple sets of input bits, the second set of input bits being received at the encoder subsequent to the first set of input bits and pause the processing after outputting the first set of output bits to wait for the second set of input bits to be received at the encoder reception component 1120. In some cases, outputting the multiple sets of output bits is based at least in part on the first set of input bits and the second set of input bits, and is independent of subsequently received sets of input bits being associated with a second input vector to be encoded into a second codeword.

Interleaver 1135 may perform interleaving of each of the multiple sets of output bits independently of each other of the multiple sets of output bits and perform interleaving of a first of the multiple sets of output bits independently of each other of the multiple sets of output bits before receiving all the input bits associated with the single input vector at the encoder at the encoder reception component 1120.

Rate matcher 1140 may perform rate matching on the first set of output bits to match a number of bits of the first set of output bits to a set of resources in the first transmission symbol period and perform rate matching on the first set of output bits to match the number of bits of the first set of output bits to the set of resources in the first transmission symbol period before receiving all the input bits associated with the single input vector at the encoder reception component 1120.

Transmission component 1145 may transmit the first set of output bits in the first transmission symbol period before a last input bit of the set of sets of input bits is received at the encoder reception component 1120 of the transmitting device. In some cases, the first set of output bits is transmitted in the first transmission symbol period before a last input bit of the second set of input bits is received at the encoder reception component 1120 of the transmitting device. In some cases, the first set of output bits is transmitted in the first transmission symbol period before completing processing of all of the multiple sets of input bits.

Figure 12:
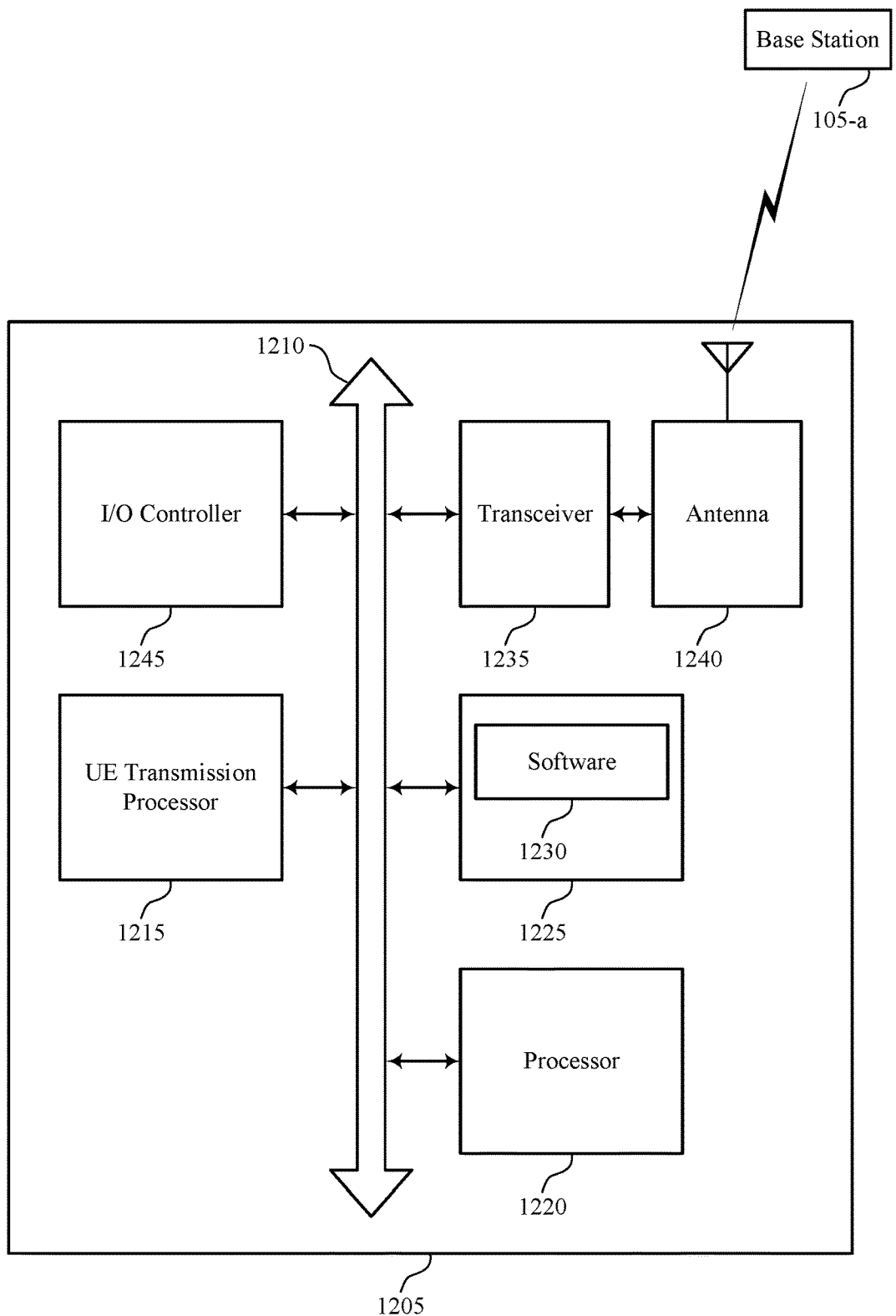
FIG. 12 illustrates a block diagram of a system including a UE that supports enhanced coding to improve transmission and reception processing time in accordance with one or more aspects of the present disclosure.

FIG. 12 shows a diagram of a system 1200 including a device 1205 that supports coding to improve transmission and reception processing time in accordance with one or more aspects of the present disclosure. Device 1205 may be an example of or include the components of configuration 200, encoding processor 300, transmission component 400, wireless device 905, wireless device 1005, or a UE 115 as described above, e.g., with reference to FIGS. 1-4, 9 and 10. Device 1205 may include components for bi-directional voice and data communications including components for transmitting and receiving communications, including UE transmission processor 1215, processor 1220, memory 1225, software 1230, transceiver 1235, antenna 1240, and I/O controller 1245. These components may be in electronic communication via one or more busses (e.g., bus 1210). Device 1205 may communicate wirelessly with one or more base stations 105 (e.g., base station 105-a). The UE transmission processor 1215 may be an example of aspects of a UE transmission processor 102, a transmission processor 915, a transmission processor 1015, or a transmission processor 1115 as described with reference to FIGS. 1 and 9-11.

Processor 1220 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting coding to improve transmission and reception processing time).

Memory 1225 may include random access memory (RAM) and read only memory (ROM). The memory 1225 may store computer-readable, computer-executable software 1230 including instructions that, when executed, cause the processor to perform various functions described herein. In some cases, the memory 1225 may contain, among other things, a basic input/output system (BIOS) which may control basic hardware and/or software operation such as the interaction with peripheral components or devices.

Software 1230 may include code to implement aspects of the present disclosure, including code to improve transmission and reception processing time. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

I/O controller 1245 may manage input and output signals for device 1205. I/O controller 1245 may also manage peripherals not integrated into device 1205. In some cases, I/O controller 1245 may represent a physical connection or port to an external peripheral. In some cases, I/O controller 1245 may utilize an operating system such as iOS®, ANDROID®, MS-DOS®, MS-WINDOWS®, OS/2®, UNIX®, LINUX®, or another known operating system. In other cases, I/O controller 1245 may represent or interact with a modem, a keyboard, a mouse, a touchscreen, or a similar device. In some cases, I/O controller 1245 may be implemented as part of a processor. In some cases, a user may interact with device 1205 via I/O controller 1245 or via hardware components controlled by I/O controller 1245.

Figure 13:
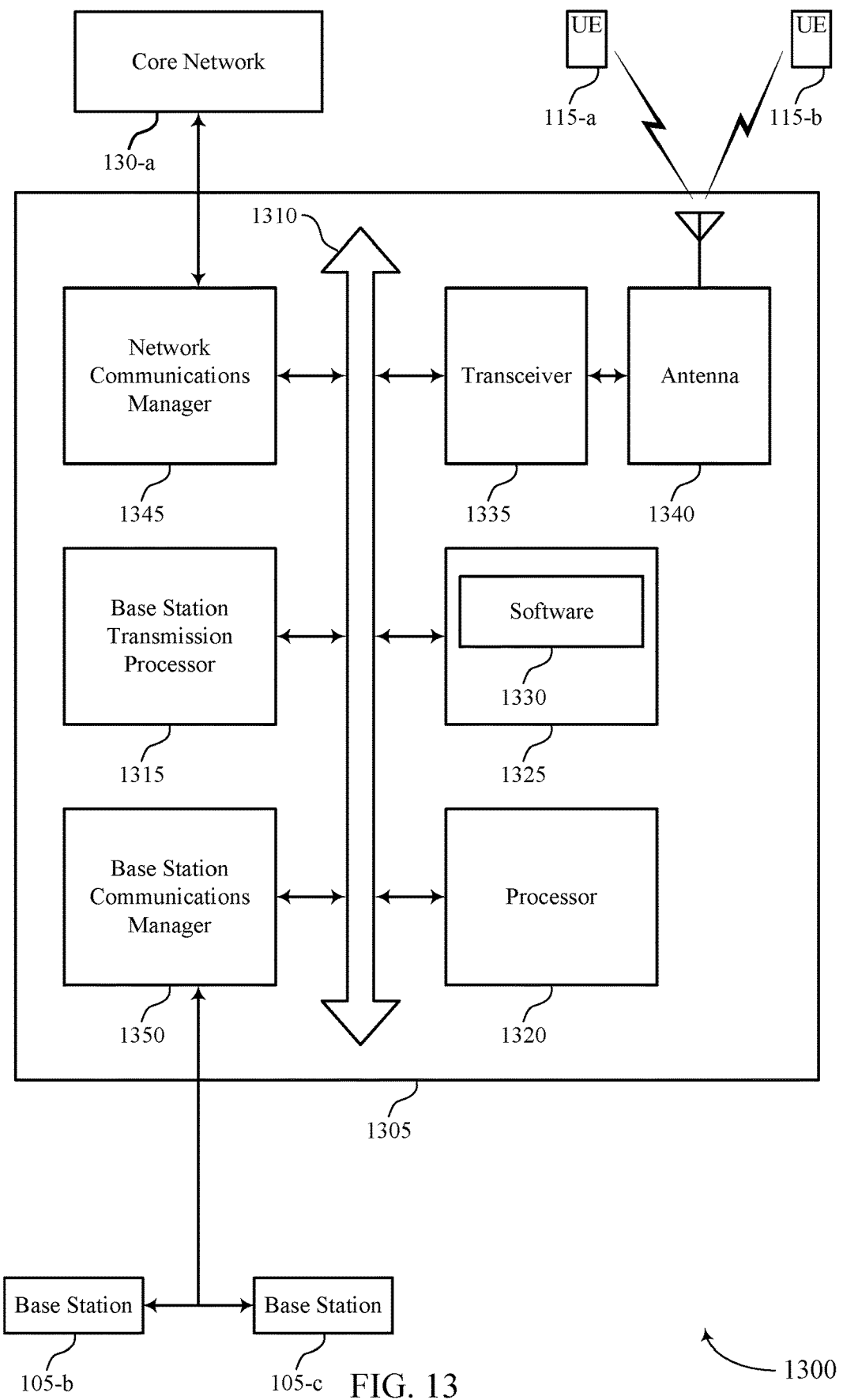
FIG. 13 illustrates a block diagram of a system including a base station that supports enhanced coding to improve transmission and reception processing time in accordance with one or more aspects of the present disclosure.

FIG. 13 shows a diagram of a system 1300 including a device 1305 that supports coding to improve transmission and reception processing time in accordance with one or more aspects of the present disclosure. Device 1305 may be an example of or include the components of configuration 200, encoding processor 300, transmission component 400, wireless device 905, wireless device 1005, or a base station 105 as described above, e.g., with reference to FIGS. 1-4, 9 and 10. Device 1305 may include components for bi-directional voice and data communications including components for transmitting and receiving communications, including base station transmission processor 1315, processor 1320, memory 1325, software 1330, transceiver 1335, antenna 1340, network communications manager 1345, and base station communications manager 1350. These components may be in electronic communication via one or more busses (e.g., bus 1310). Device 1305 may communicate wirelessly with one or more UEs 115 (e.g., UEs 115-a and 115-b). The base station transmission processor 1315 may be an example of aspects of a base station transmission processor 101, a transmission processor 915, a transmission processor 1015, or a transmission processor 1115 as described with reference to FIGS. 1 and 9-11.

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting coding to improve transmission and reception processing time).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware and/or software operation such as the interaction with peripheral components or devices.

Software 1330 may include code to implement aspects of the present disclosure, including code to improve transmission and reception processing time. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In some cases, the wireless device may include a single antenna 1340. However, in some cases the device may have more than one antenna 1340, which may be capable of concurrently transmitting or receiving multiple wireless transmissions.

Network communications manager 1345 may manage communications with core network 130-a (e.g., via one or more wired backhaul links). For example, the network communications manager 1345 may manage the transfer of data communications for client devices, such as one or more UEs 115.

Base station communications manager 1350 may manage communications with other base stations 105 (e.g., base stations 105-b and 105-c), and may include a controller or scheduler for controlling communications with UEs 115 in cooperation with other base stations 105. For example, the base station communications manager 1350 may coordinate scheduling for transmissions to UEs 115 for various interference mitigation techniques such as beamforming or joint transmission. In some examples, base station communications manager 1350 may provide an X2 interface within an LTE/LTE-A wireless communication network technology to provide communication between base stations 105.

Figure 14:
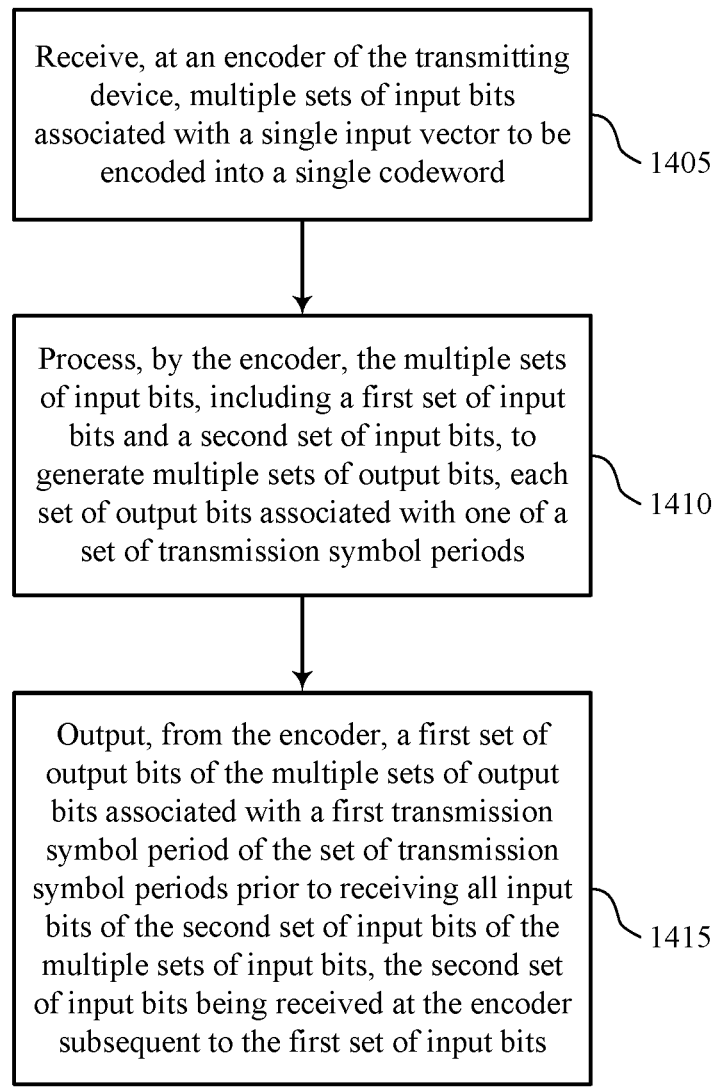
FIGS. 14 through 16 illustrate methods for enhanced coding to improve transmission and reception processing time in accordance with one or more aspects of the present disclosure.

FIG. 14 shows a flowchart illustrating a method 1400 for coding to improve transmission and reception processing time in accordance with one or more aspects of the present disclosure. The operations of method 1400 may be implemented by a UE 115 or base station 105 or its components as described herein. For example, the operations of method 1400 may be performed by a transmission processor as described with reference to FIGS. 9 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the UE 115 or base station 105 may receive, at an encoder of the transmitting device, a plurality of sets of input bits associated with a single input vector to be encoded into a single codeword. The operations of block 1405 may be performed according to the methods described with reference to FIGS. 1 through 8. In certain examples, aspects of the operations of block 1405 may be performed by an encoder reception component as described with reference to FIGS. 9 through 13.

At block 1410 the UE 115 or base station 105 may process, by the encoder, the plurality of sets of input bits, including a first set of input bits and a second set of input bits, to generate a plurality of sets of output bits, each set of output bits associated with one of a plurality of transmission symbol periods. The operations of block 1410 may be performed according to the methods described with reference to FIGS. 1 through 8. In certain examples, aspects of the operations of block 1410 may be performed by an encoder as described with reference to FIGS. 9 through 13.

At block 1415 the UE 115 or base station 105 may output, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits. The operations of block 1415 may be performed according to the methods described with reference to FIGS. 1 through 8. In certain examples, aspects of the operations of block 1415 may be performed by an encoder output component as described with reference to FIGS. 9 through 13.

Figure 15:
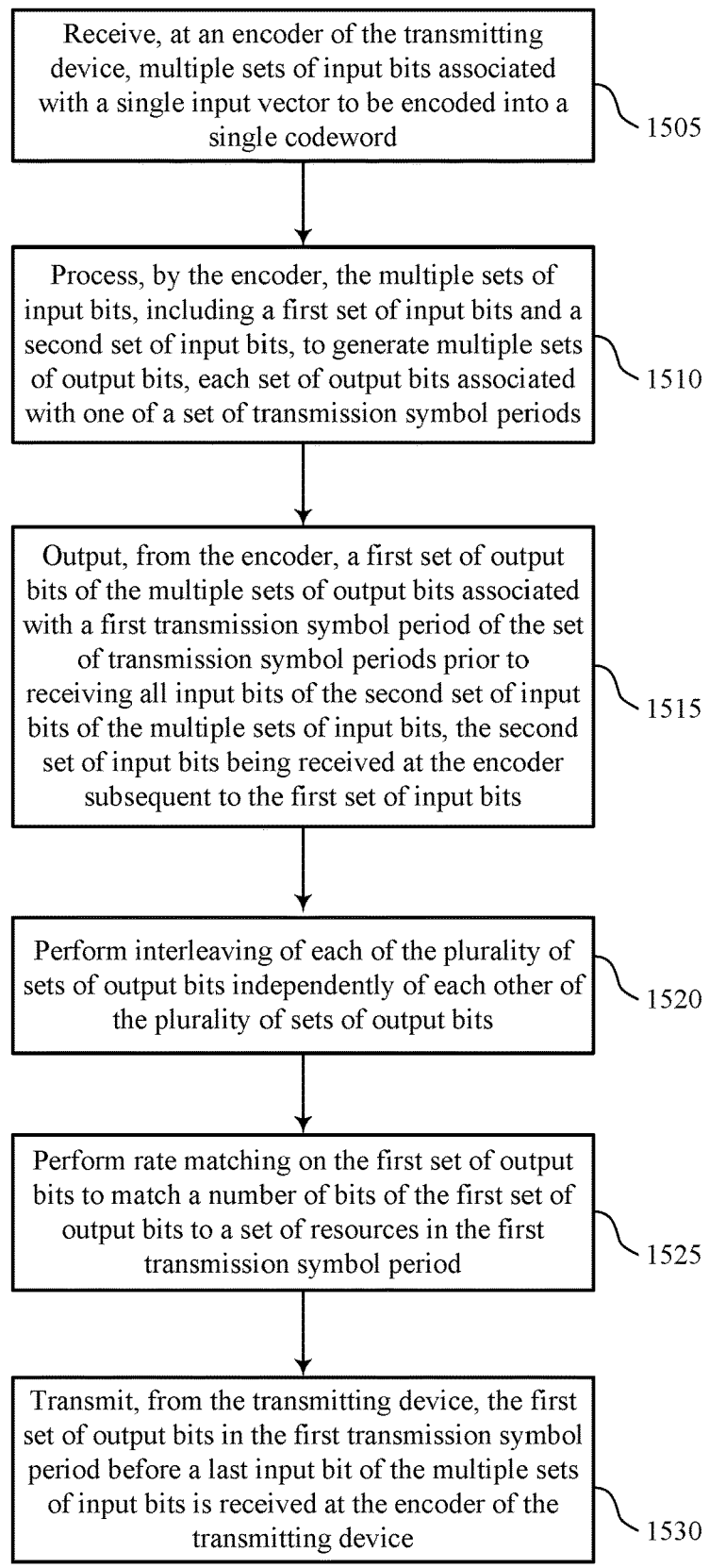

FIG. 15 shows a flowchart illustrating a method 1500 for coding to improve transmission and reception processing time in accordance with one or more aspects of the present disclosure. The operations of method 1500 may be implemented by a UE 115 or base station 105 or its components as described herein. For example, the operations of method 1500 may be performed by a transmission processor as described with reference to FIGS. 9 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1505 the UE 115 or base station 105 may receive, at an encoder of the transmitting device, a plurality of sets of input bits associated with a single input vector to be encoded into a single codeword. The operations of block 1505 may be performed according to the methods described with reference to FIGS. 1 through 8. In certain examples, aspects of the operations of block 1505 may be performed by an encoder reception component as described with reference to FIGS. 9 through 13.

At block 1510 the UE 115 or base station 105 may process, by the encoder, the plurality of sets of input bits, including a first set of input bits and a second set of input bits, to generate a plurality of sets of output bits, each set of output bits associated with one of a plurality of transmission symbol periods. The operations of block 1510 may be performed according to the methods described with reference to FIGS. 1 through 8. In certain examples, aspects of the operations of block 1510 may be performed by an encoder as described with reference to FIGS. 9 through 13.

At block 1515 the UE 115 or base station 105 may output, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits. The operations of block 1515 may be performed according to the methods described with reference to FIGS. 1 through 8. In certain examples, aspects of the operations of block 1515 may be performed by an encoder output component as described with reference to FIGS. 9 through 13.

At block 1520 the UE 115 or base station 105 may performing interleaving of each of the plurality of sets of output bits independently of each other of the plurality of sets of output bits. The operations of block 1520 may be performed according to the methods described with reference to FIGS. 1 through 8. In certain examples, aspects of the operations of block 1520 may be performed by an interleaver as described with reference to FIGS. 9 through 13.

At block 1525 the UE 115 or base station 105 may perform rate matching on the first set of output bits to match a number of bits of the first set of output bits to a set of resources in the first transmission symbol period. The operations of block 1525 may be performed according to the methods described with reference to FIGS. 1 through 8. In certain examples, aspects of the operations of block 1525 may be performed by a rate matcher as described with reference to FIGS. 9 through 13.

At block 1530 the UE 115 or base station 105 may transmit, from the transmitting device, the first set of output bits in the first transmission symbol period before a last input bit of the plurality of sets of input bits is received at the encoder of the transmitting device. The operations of block 1530 may be performed according to the methods described with reference to FIGS. 1 through 8. In certain examples, aspects of the operations of block 1530 may be performed by a transmission component as described with reference to FIGS. 9 through 13.

Figure 16:
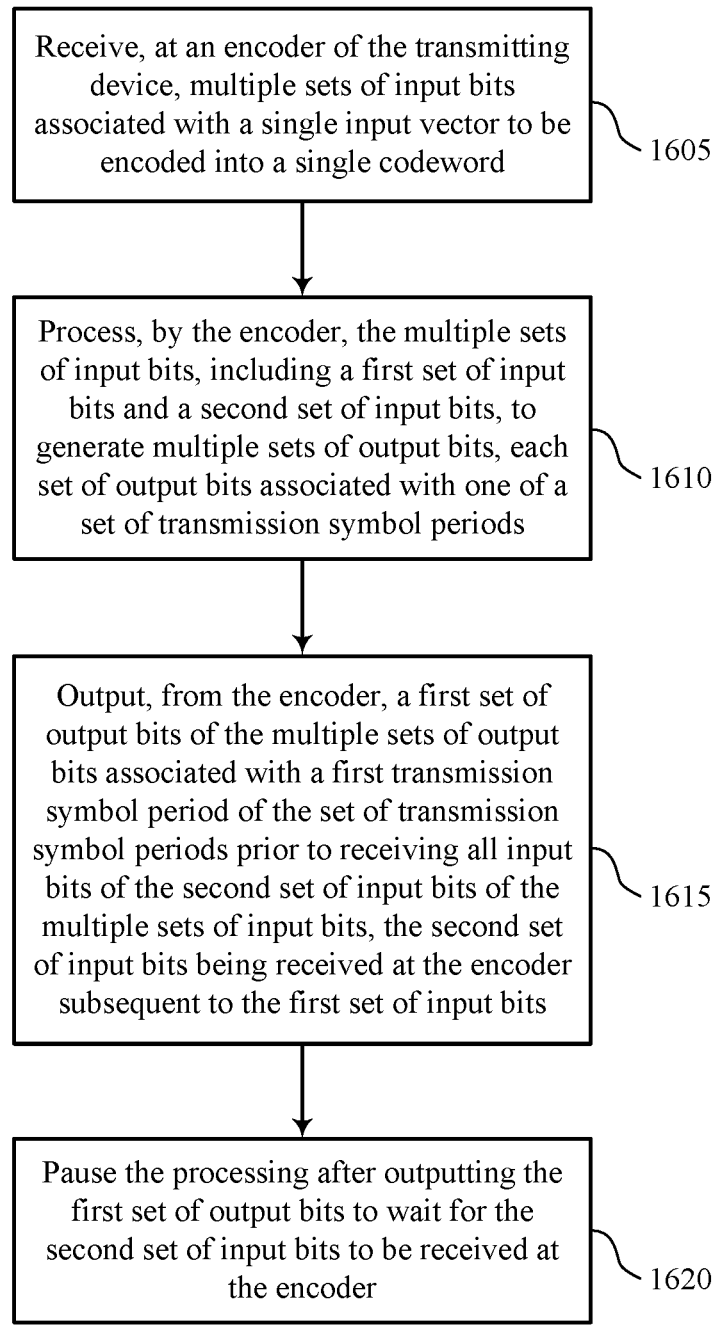

FIG. 16 shows a flowchart illustrating a method 1600 for coding to improve transmission and reception processing time in accordance with one or more aspects of the present disclosure. The operations of method 1600 may be implemented by a UE 115 or base station 105 or its components as described herein. For example, the operations of method 1600 may be performed by a transmission processor as described with reference to FIGS. 9 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1605 the UE 115 or base station 105 may receive, at an encoder of the transmitting device, a plurality of sets of input bits associated with a single input vector to be encoded into a single codeword. The operations of block 1605 may be performed according to the methods described with reference to FIGS. 1 through 8. In certain examples, aspects of the operations of block 1605 may be performed by an encoder reception component as described with reference to FIGS. 9 through 13.

At block 1610 the UE 115 or base station 105 may process, by the encoder, the plurality of sets of input bits, including a first set of input bits and a second set of input bits, to generate a plurality of sets of output bits, each set of output bits associated with one of a plurality of transmission symbol periods. The operations of block 1610 may be performed according to the methods described with reference to FIGS. 1 through 8. In certain examples, aspects of the operations of block 1610 may be performed by an encoder as described with reference to FIGS. 9 through 13.

At block 1615 the UE 115 or base station 105 may output, from the encoder, a first set of output bits of the plurality of sets of output bits associated with a first transmission symbol period of the plurality of transmission symbol periods prior to receiving all input bits of the second set of input bits of the plurality of sets of input bits, the second set of input bits being received at the encoder subsequent to the first set of input bits. The operations of block 1615 may be performed according to the methods described with reference to FIGS. 1 through 8. In certain examples, aspects of the operations of block 1615 may be performed by an encoder output component as described with reference to FIGS. 9 through 13.

At block 1620 the UE 115 or base station 105 may pause the processing after outputting the first set of output bits to wait for the second set of input bits to be received at the encoder. The operations of block 1620 may be performed according to the methods described with reference to FIGS. 1 through 8. In certain examples, aspects of the operations of block 1620 may be performed by an encoder output component as described with reference to FIGS. 9 through 13.

It should be noted that the methods described above describe possible implementations, and that the operations and the operations may be rearranged or otherwise modified and that other implementations are possible. Furthermore, aspects from two or more of the methods may be combined.

Techniques described herein may be used for various wireless communications systems such as CDMA, TDMA, FDMA, OFDMA, single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1X, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP LTE and LTE-A are new releases of UMTS that use E-UTRA. UTRA, E-UTRA, UMTS, LTE, LTE-A, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE system may be described for purposes of example, and LTE terminology may be used in much of the description, the techniques described herein are applicable beyond LTE applications.

In LTE/LTE-A networks, including such networks described herein, the term eNB may be generally used to describe the base stations. The wireless communications system or systems described herein may include a heterogeneous LTE/LTE-A network in which different types of eNBs provide coverage for various geographical regions. For example, each eNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and configuration 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary operation that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method of wireless communication at a transmitting device, comprising:
    receiving, at an encoder of the transmitting device, a plurality of sets of input bits associated with a single input vector to be encoded into a single codeword;
    processing, by the encoder, the plurality of sets of input bits, including a first set of input bits corresponding to a first transmission symbol period and a second set of input bits corresponding to a second transmission symbol period, to generate a plurality of sets of output bits, each set of output bits associated with one of a plurality of transmission symbol periods comprising the first transmission symbol period and the second transmission symbol period; and
    outputting, from the encoder, a first set of output bits of the plurality of sets of output bits associated with the first set of input bits and the first transmission symbol period prior to receiving all input bits of the second set of input bits of the plurality of sets of input bits, the second set of input bits being received at the encoder subsequent to the first set of input bits.

2. The method of claim 1, further comprising:
    performing interleaving of each of the plurality of sets of output bits independently of each other of the plurality of sets of output bits.

3. The method of claim 2, further comprising:
    performing interleaving of a first of the plurality of sets of output bits before receiving all the input bits associated with the single input vector at the encoder.

4. The method of claim 1, further comprising:
    performing rate matching on the first set of output bits to match a number of bits of the first set of output bits to a set of resources in the first transmission symbol period.

5. The method of claim 4, further comprising:
    performing rate matching on the first set of output bits to match the number of bits of the first set of output bits to the set of resources in the first transmission symbol period before receiving all the input bits associated with the single input vector at the encoder.

6. The method of claim 1, further comprising:
    transmitting, from the transmitting device, the first set of output bits in the first transmission symbol period before a last input bit of the plurality of sets of input bits is received at the encoder of the transmitting device.

7. The method of claim 6, wherein the first set of output bits is transmitted in the first transmission symbol period before a last input bit of the second set of input bits is received at the encoder of the transmitting device.

8. The method of claim 6, wherein the first set of output bits is transmitted in the first transmission symbol period before completing processing, by the encoder, of all of the plurality of sets of input bits.

9. The method of claim 1, wherein an initial state of each of the plurality of sets of output bits is determined based at least in part on one or more input bits from one of the plurality of sets of input bits or an initial encoder state.

10. The method of claim 1, wherein the plurality of transmission symbol periods comprises contiguous transmission symbol periods.

11. The method of claim 1, wherein at least one of the plurality of sets of input bits comprises a different number of bits than at least one other of the plurality of sets of input bits.

12. The method of claim 1, further comprising:
    pausing the processing after outputting the first set of output bits to wait for the second set of input bits to be received at the encoder.

13. The method of claim 1, wherein the processing of the plurality of sets of input bits comprises:
    applying a convolutional code, tail-biting convolutional code, low-density parity-check (LDPC) code, or turbo code to generate the plurality of sets of output bits.

14. An apparatus for wireless communication, comprising:
    a processor;
    memory in electronic communication with the processor; and
    the processor and memory configured to:
        receive, at an encoder of a transmitting device, a plurality of sets of input bits associated with a single input vector to be encoded into a single codeword;
        process, by the encoder, the plurality of sets of input bits, including a first set of input bits corresponding to a first transmission symbol period and a second set of input bits corresponding to a second transmission symbol period, to generate a plurality of sets of output bits, each set of output bits associated with one of a plurality of transmission symbol periods comprising the first transmission symbol period and the second transmission symbol period; and
        output, from the encoder, a first set of output bits of the plurality of sets of output bits associated with the first set of input bits and the first transmission symbol period prior to receiving all input bits of the second set of input bits of the plurality of sets of input bits, the second set of input bits being received at the encoder subsequent to the first set of input bits.

15. The apparatus of claim 14, wherein the processor and memory are further configured to:
    perform interleaving of each of the plurality of sets of output bits independently of each other of the plurality of sets of output bits.

16. The apparatus of claim 15, wherein the processor and memory are further configured to:
    perform interleaving of a first of the plurality of sets of output bits before receiving all the input bits associated with the single input vector at the encoder.

17. The apparatus of claim 14, wherein the processor and memory are further configured to:
    perform rate matching on the first set of output bits to match a number of bits of the first set of output bits to a set of resources in the first transmission symbol period.

18. The apparatus of claim 17, wherein the processor and memory are further configured to:

perform rate matching on the first set of output bits to match the number of bits of the first set of output bits to the set of resources in the first transmission symbol period before receiving all the input bits associated with the single input vector at the encoder.

19. The apparatus of claim 14, wherein the processor and memory are further configured to:
transmit, from the transmitting device, the first set of output bits in the first transmission symbol period before a last input bit of the plurality of sets of input bits is received at the encoder of the transmitting device.

20. The apparatus of claim 19, wherein the first set of output bits is transmitted in the first transmission symbol period before a last input bit of the second set of input bits is received at the encoder of the transmitting device.

21. The apparatus of claim 19, wherein the first set of output bits is transmitted in the first transmission symbol period before completing processing, by the encoder, of all of the plurality of sets of input bits.

22. The apparatus of claim 14, wherein an initial state of each of the plurality of sets of output bits is determined based at least in part on one or more input bits from one of the plurality of sets of input bits or an initial encoder state.

23. The apparatus of claim 14, wherein at least one of the plurality of sets of input bits comprises a different number of bits than at least one other of the plurality of sets of input bits.

24. The apparatus of claim 14, wherein the processor and memory are further configured to:
pause the processing after outputting the first set of output bits to wait for the second set of input bits to be received at the encoder.

25. An apparatus for wireless communication, comprising:
means for receiving, at an encoder of a transmitting device, a plurality of sets of input bits associated with a single input vector to be encoded into a single codeword;
means for processing, by the encoder, the plurality of sets of input bits, including a first set of input bits corresponding to a first transmission symbol period and a second set of input bits corresponding to a second transmission symbol period, to generate a plurality of sets of output bits, each set of output bits associated with one of a plurality of transmission symbol periods comprising the first transmission symbol period and the second transmission symbol period; and
means for outputting, from the encoder, a first set of output bits of the plurality of sets of output bits associated with the first set of input bits and the first transmission symbol period prior to receiving all input bits of the second set of input bits of the plurality of sets of input bits, the second set of input bits being received at the encoder subsequent to the first set of input bits.

26. The apparatus of claim 25, further comprising:
means for performing interleaving of each of the plurality of sets of output bits independently of each other of the plurality of sets of output bits.

27. The apparatus of claim 25, further comprising:
means for performing rate matching on the first set of output bits to match a number of bits of the first set of output bits to a set of resources in the first transmission symbol period.

28. The apparatus of claim 25, further comprising:
means for transmitting, from the transmitting device, the first set of output bits in the first transmission symbol period before a last input bit of the plurality of sets of input bits is received at the encoder of the transmitting device.

29. The apparatus of claim 25, further comprising:
means for pausing the processing after outputting the first set of output bits to wait for the second set of input bits to be received at the encoder.

30. A non-transitory computer readable medium storing code for wireless communication, the code comprising instructions executable by a processor to:
receive, at an encoder of a transmitting device, a plurality of sets of input bits associated with a single input vector to be encoded into a single codeword;
process, by the encoder, the plurality of sets of input bits including a first set of input bits corresponding to a first transmission symbol period and a second set of input bits corresponding to a second transmission symbol period, to generate a plurality of sets of output bits, each set of output bits associated with one of a plurality of transmission symbol periods comprising the first transmission symbol period and the second transmission symbol period; and
output, from the encoder, a first set of output bits of the plurality of sets of output bits associated with the first set of input bits and the first transmission symbol period prior to receiving all input bits of the second set of input bits of the plurality of sets of input bits, the second set of input bits being received at the encoder subsequent to the first set of input bits.

* * * * *